United States Patent
Ohkawa

(10) Patent No.: US 7,119,387 B2
(45) Date of Patent: Oct. 10, 2006

(54) SOLID-STATE IMAGE SENSOR AND METHOD FOR FABRICATING THE SAME

(75) Inventor: Narumi Ohkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 129 days.

(21) Appl. No.: 10/992,653

(22) Filed: Nov. 22, 2004

(65) Prior Publication Data
US 2006/0011952 A1    Jan. 19, 2006

(30) Foreign Application Priority Data
Jul. 16, 2004    (JP)    .............................. 2004-209681

(51) Int. Cl.
*H01L 31/09*    (2006.01)
(52) U.S. Cl. ...................... 257/292; 257/213; 257/288; 257/290; 257/291; 257/E27.133; 438/48; 438/57
(58) Field of Classification Search ...................... None
See application file for complete search history.

(56) References Cited

U.S. PATENT DOCUMENTS 5,781,233 A * 7/1998 Liang et al.

FOREIGN PATENT DOCUMENTS

| JP | 2002-170945 A | 6/2002 |
|---|---|---|
| JP | 2002-329854 A | 11/2002 |
| JP | 2004-039832 A | 2/2004 |

* cited by examiner

*Primary Examiner*—Nathan J. Flynn
*Assistant Examiner*—Kevin Quinto
(74) *Attorney, Agent, or Firm*—Westerman, Hattori, Daniels & Adrian, LLP.

(57) ABSTRACT

A solid-state image sensor comprises a semiconductor substrate of a first conductivity type having a color pixel region and a black pixel region; a first well of the first conductivity type formed in the color pixel region; a second well of the first conductivity type formed in the black pixel region; a third well of a second conductivity type formed, surrounding the second well and isolating the second well from the rest region of the semiconductor substrate; a color pixel formed in the first well in the color pixel region and including a first photodiode and a first read transistor for reading a signal generated by the first photodiode; and a black pixel formed in the second well in the black pixel region and including a second photodiode and a second read transistor for reading a signal generated by the second photodiode. The first well includes a first buried impurity doped layer of the first conductivity type formed in a bottom thereof in a region where the first read transistor is formed. The second well includes a second buried impurity doped layer of the first conductivity type formed in a bottom thereof in a region where the second photodiode is formed and a region where the second read transistor is formed.

20 Claims, 29 Drawing Sheets

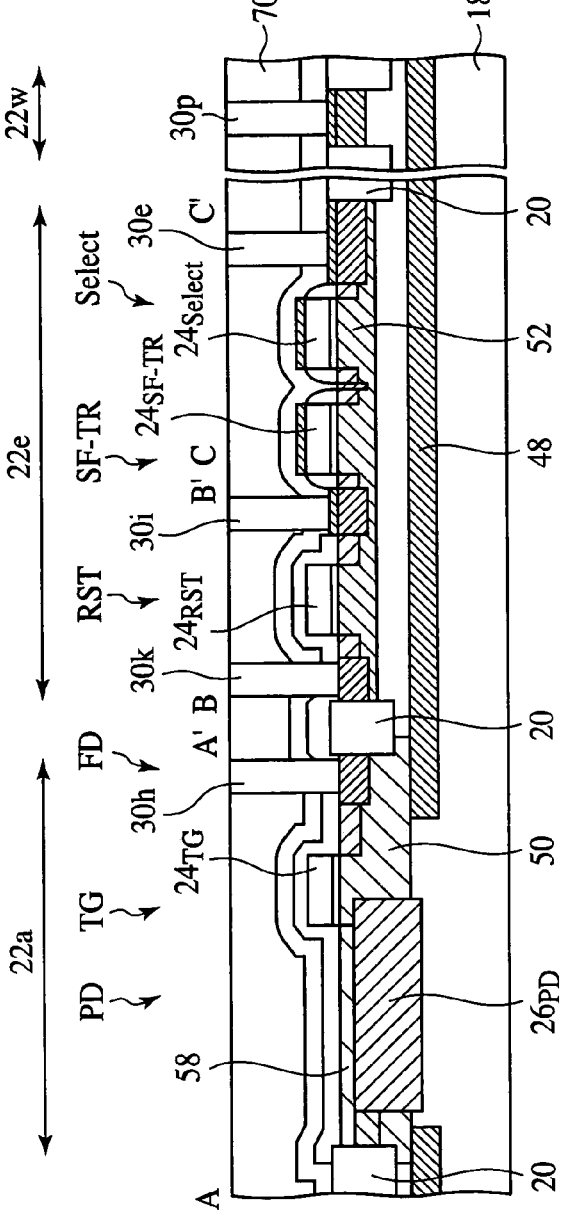
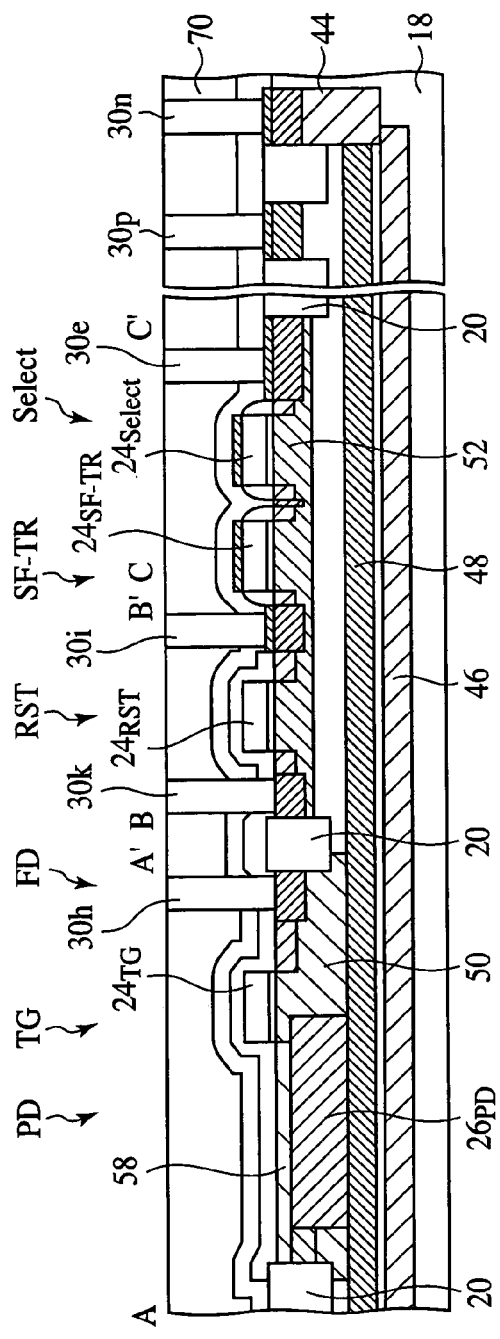
FIG. 7A
FIG. 7B

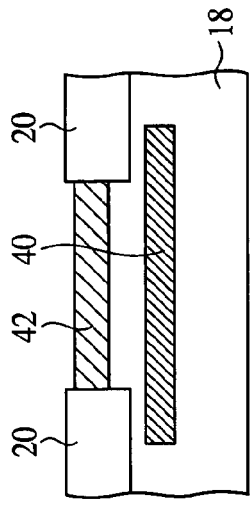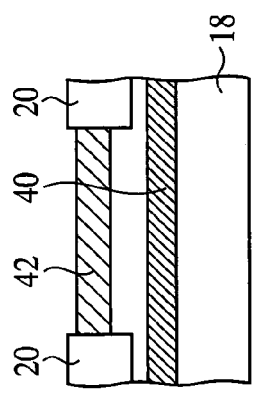
FIG. 10A
FIG. 10B
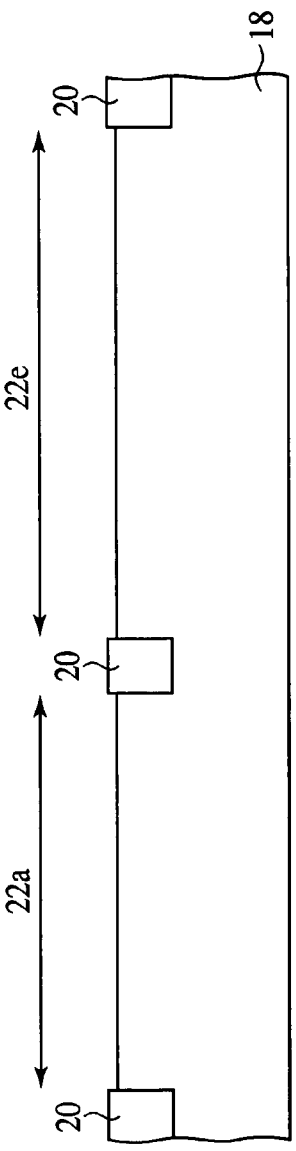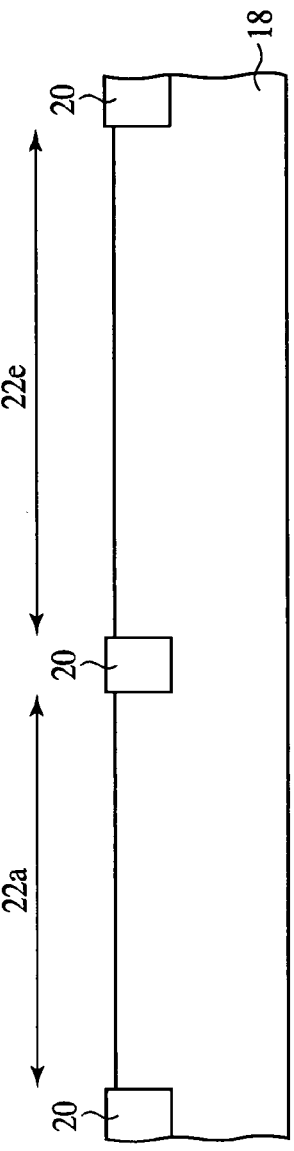
FIG. 10C
FIG. 10D

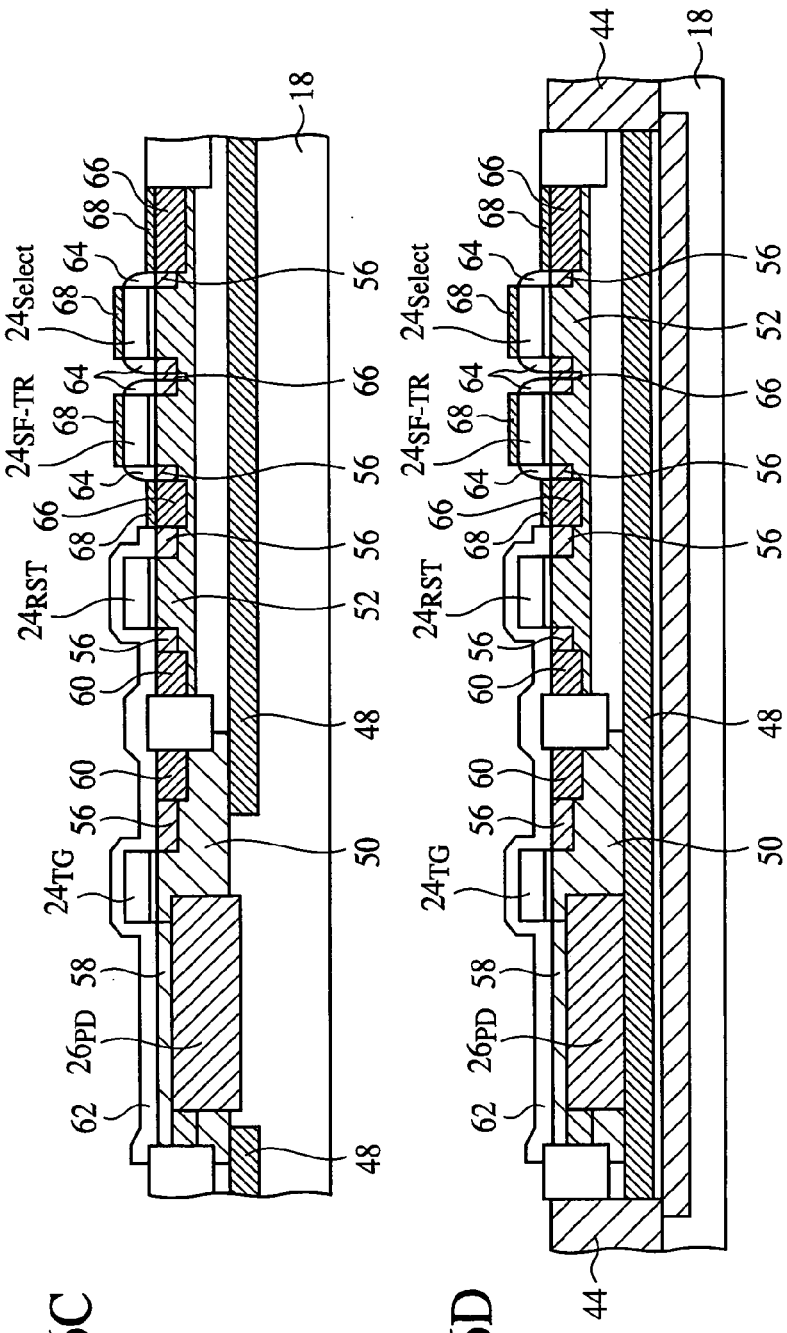

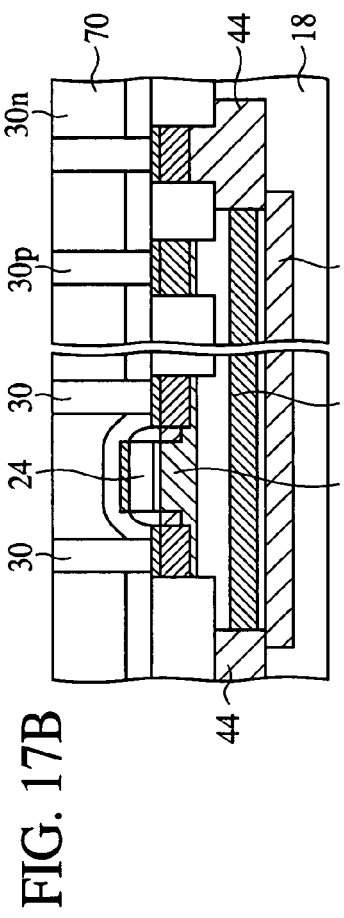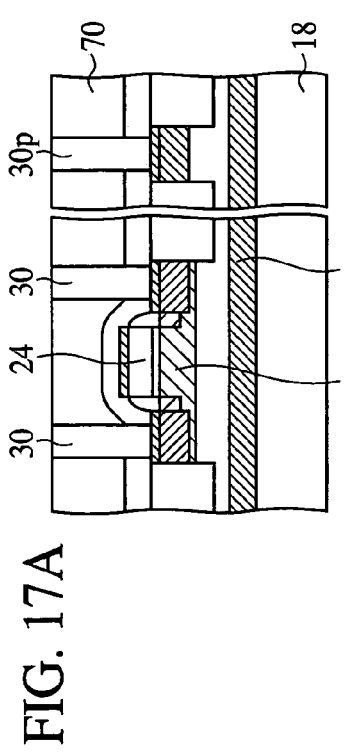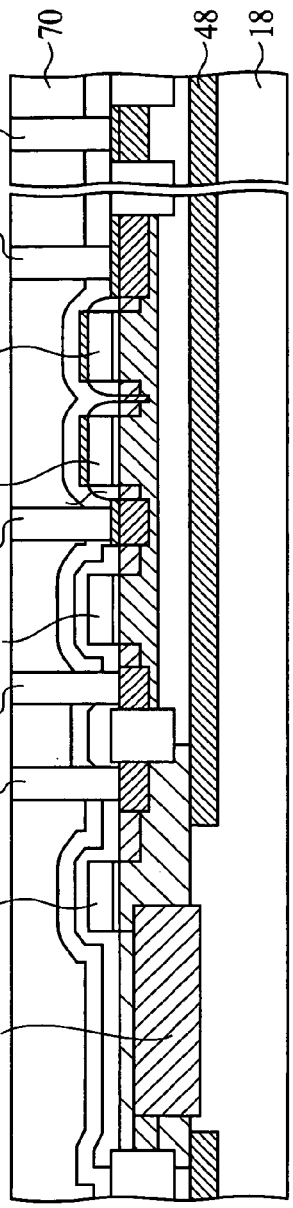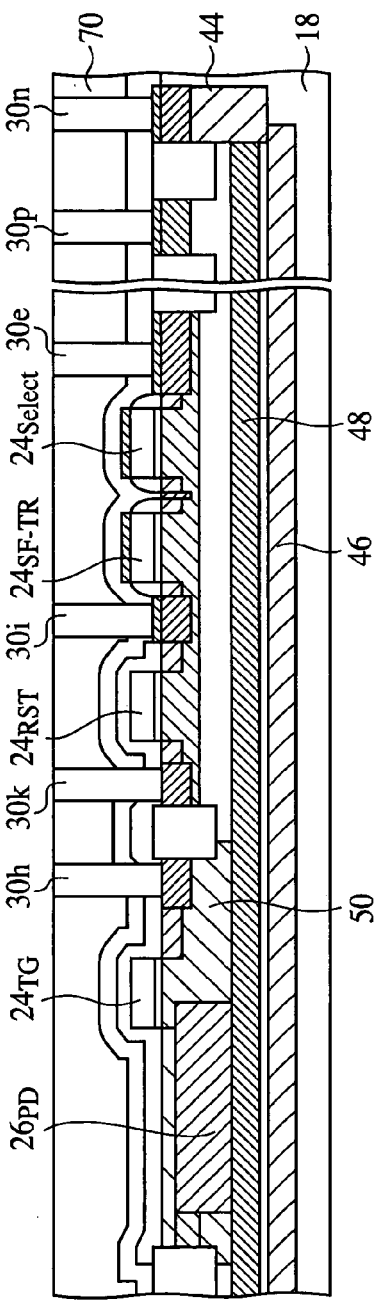
FIG. 17A
FIG. 17B
FIG. 17C
FIG. 17D

SOLID-STATE IMAGE SENSOR AND METHOD FOR FABRICATING THE SAME

CROSS-REFERENCE TO RELATED APPLICATIONS

This application is based upon and claims the benefit of priority from the prior Japanese Patent Application No. 2004-209681, filed on Jul. 16, 2004, the entire contents of which are incorporated herein by reference.

BACKGROUND OF THE INVENTION

The present invention relates to a solid-state image sensor formed of CMOS and a method for fabricating the same.

As a solid-state image sensor using semiconductor materials, an image sensor formed of CMOS (CMOS image sensor) is known.

The CMOS image sensor includes a pixel unit shielded from light, which are called a black pixel unit (also optical black unit) in addition to a light receiving unit of color pixel unit. The black pixel unit is for generating a reference value of a pixel signal in a dark state for the prevention of changes of a signal level due to temperature changes, etc. Accordingly, it is preferable that the black pixel unit is formed isolatable from noises of the surroundings (the color pixel unit and peripheral circuits).

The structure of the conventional solid-state image sensor will be explained with reference to FIGS. 29A and 29B. FIG. 29A is a plan view of the conventional solid-state image sensor, which shows the structure thereof. FIG. 29B is a diagrammatic sectional view of the conventional solid-state image sensor, which shows the structure thereof.

As shown in FIG. 29A, a black pixel array unit 102 is disposed around a color pixel array unit 100 which is a light receiving unit. As shown in FIG. 29B, elements (e.g., photodiodes 104C) forming the color pixel array unit 100 are formed in a p-well 112 formed in a silicon substrate 110. As shown in FIG. 29B, elements (e.g., photodiodes 104B) forming the black pixel array unit 102 are formed in a double well (or a triple well), i.e., a p-well 116 isolated from the silicon substrate 110 by an n-well 114. A shield layer 118 is formed, covering in the color pixel array unit 100 the region other than the regions where the photodiodes are formed, and covering the entire surface of the black pixel array unit 102.

The black pixel array unit 102 is formed in the double well as shown in FIG. 29B, whereby the black pixel array unit 102 can be electrically completely isolated from the color pixel array unit 100 and peripheral circuits (not shown), and the produced images can have high quality.

The solid-state image sensor having the black pixel array unit formed in the double well is described in, e.g., Reference 1 (Japanese published unexamined patent application No. 2002-329854).

SUMMARY OF THE INVENTION

As one example of the CMOS image sensor, a 4-Tr CMOS image sensor using buried photodiodes buried in a silicon substrate is known.

However, when the black pixel array unit of the CMOS image sensor including the buried photodiodes is formed in the double well, the buried n-well and the buried n-type layer of the photodiode are near each other in the substrate. The buried n-well and the buried n-type layer of the photodiodes are accordingly insufficiently electrically isolated, with a worst result that both may be electrically connected, causing operational defects.

The double well structure, in many cases, is also used in the peripheral circuit region, especially the region of the analog circuit, where the n-channel transistors are formed. The electric isolation of the buried n-well from the buried n-type layer of the photodiode must be considered, taking into account of ensuring the matching with the process of fabricating the peripheral circuit transistors.

An object of the present invention is to provide a structure of the solid-state image sensor comprising a color pixel array unit formed in the usual well and a black pixel array unit formed in an inner well of the double well, which ensures the compatibility with the fabrication process of the peripheral circuit transistors while realizing high sensitivity of the pixels, and a method for fabricating the solid-state image sensor having such the structure.

According to one aspect of the present invention, there is provided a solid-state image sensor comprising: a semiconductor substrate of a first conductivity type having a color pixel region and a black pixel region; a first well of the first conductivity type formed in the color pixel region; a second well of the first conductivity type formed in the black pixel region; a third well of a second conductivity type formed, surrounding the second well and isolating the second well from the rest region of the semiconductor substrate; a color pixel formed in the first well in the color pixel region and including a first photodiode and a first read transistor for reading a signal generated by the first photodiode; and a black pixel formed in the second well in the black pixel region and including a second photodiode and a second read transistor for reading a signal generated by the second photodiode, the first well including a first buried impurity doped layer of the first conductivity type formed at a bottom thereof in a region where the first read transistor is formed, and the second well including a second buried impurity doped layer of the first conductivity type formed at a bottom thereof in a region where the second photodiode is formed and a region where the second read transistor is formed.

According to another aspect of the present invention, there is provided a method for fabricating a solid-state image sensor comprising: a first well of a first conductivity type formed in a color pixel region of a semiconductor substrate of the first conductivity type; a second well of the first conductivity type formed in a black pixel region of the semiconductor substrate; a third well of a second conductivity type formed, surrounding the second well and isolating the second well from the rest region of the semiconductor substrate; a color pixel formed in the first well and including a first photodiode and a first read transistor reading a signal generated by the first photodiode; and a black pixel formed in the second well and including a second photodiode and a second read transistor reading a signal generated by the second photodiode, the method comprising the step of: implanting an impurity of the first conductivity type to form a first buried impurity doped layer in a bottom of the first well in a region for the first read transistor to be formed in and a second buried impurity doped layer in a bottom of the second well in a region for the second photodiode to be formed in and a region for the second read transistor to be formed in.

According to the present invention, in the solid-state image sensor, the pixel array unit is formed in a usual well, and the black pixel array is formed in an inner well of a double well, a buried impurity diffused region is provided between the photodiode of the black pixel and the outer well of the double well, whereby the photodiode and the outer well of the double well can be isolated from each other without failure. The buried impurity diffused region is not formed below the photodiode of the color pixel, whereby the depletion layer of the photodiode of the color pixel can extend deep in the substrate, and accordingly, the isolation between the photodiode and the outer well of the double well can be ensured without sacrificing the sensitivity of the photodiode of the color pixel.

In the color pixel, the peripheral end of the buried diffused layer of the photodiode and the peripheral end of the buried impurity diffused region with the color pixel formed in are sufficiently spaced from each other, whereby the depletion layer of the photodiode can extend sufficiently deep into the substrate. This increases the sensitivity of the photodiode.

The buried impurity diffused region to be formed in the pixel array unit and the buried impurity diffused region to be formed in the peripheral circuit unit are formed separately, whereby the characteristics of the pixel array and the characteristics of the peripheral circuit transistors can be separately optimized.

The buried impurity diffused region to be formed in the pixel array unit is formed by ion implantation in a random direction, whereby the depth-wise distribution of the impurity has improved intra-plane uniformity, and the pixels can few fabrication fluctuations. The buried impurity diffused region in the peripheral circuit unit is formed by ion implantation in the direction normal to the substrate, whereby fluctuations of the device characteristics due to offsets of ion implanted parts and variations of the implanted depth near the photoresist end can be prevented.

A heavily doped region is formed on the bottom of the buried diffused layer of the photodiode of the black pixel, or the concentration of the buried impurity diffused region formed below the photodiode of the black pixel is made lower than a concentration in the rest region, whereby the potential of the photodiode of the black pixel can be made deep. This permits the potential depth of the photodiode of the black pixel to be approximate to the potential depth of the photodiode of the color pixel, and substantially the same saturated charge amount as that of the color pixel can be realized.

An impurity diffused region extended from the surface down to the vicinity of the bottom of the device isolation film is provided in the region between the read transistor formed region and the region between the photodiode and the device isolation film, whereby the ability of the isolation between the photodiode and the device isolation film can be further increased.

BRIEF DESCRIPTION OF THE DRAWINGS

FIGS. 7A and 7B are diagrammatic sectional views of the solid-state image sensor according to the first embodiment of the present invention, which show the structure thereof.

FIGS. 10A–10D, 11A–11D, 12A–12D, 13A–13D, 14A–14D, 15A–15D, 16A–16D and 17A–17D are sectional views of the solid-state image sensor according to the first embodiment of the present invention in the steps of the method for fabricating the same, which show the method.

DETAILED DESCRIPTION OF THE INVENTION

[A First Embodiment]

The solid-state image sensor and the method for fabricating the same according to a first embodiment of the present invention will be explained with reference to FIGS. 1 to 20.

Figure 1:
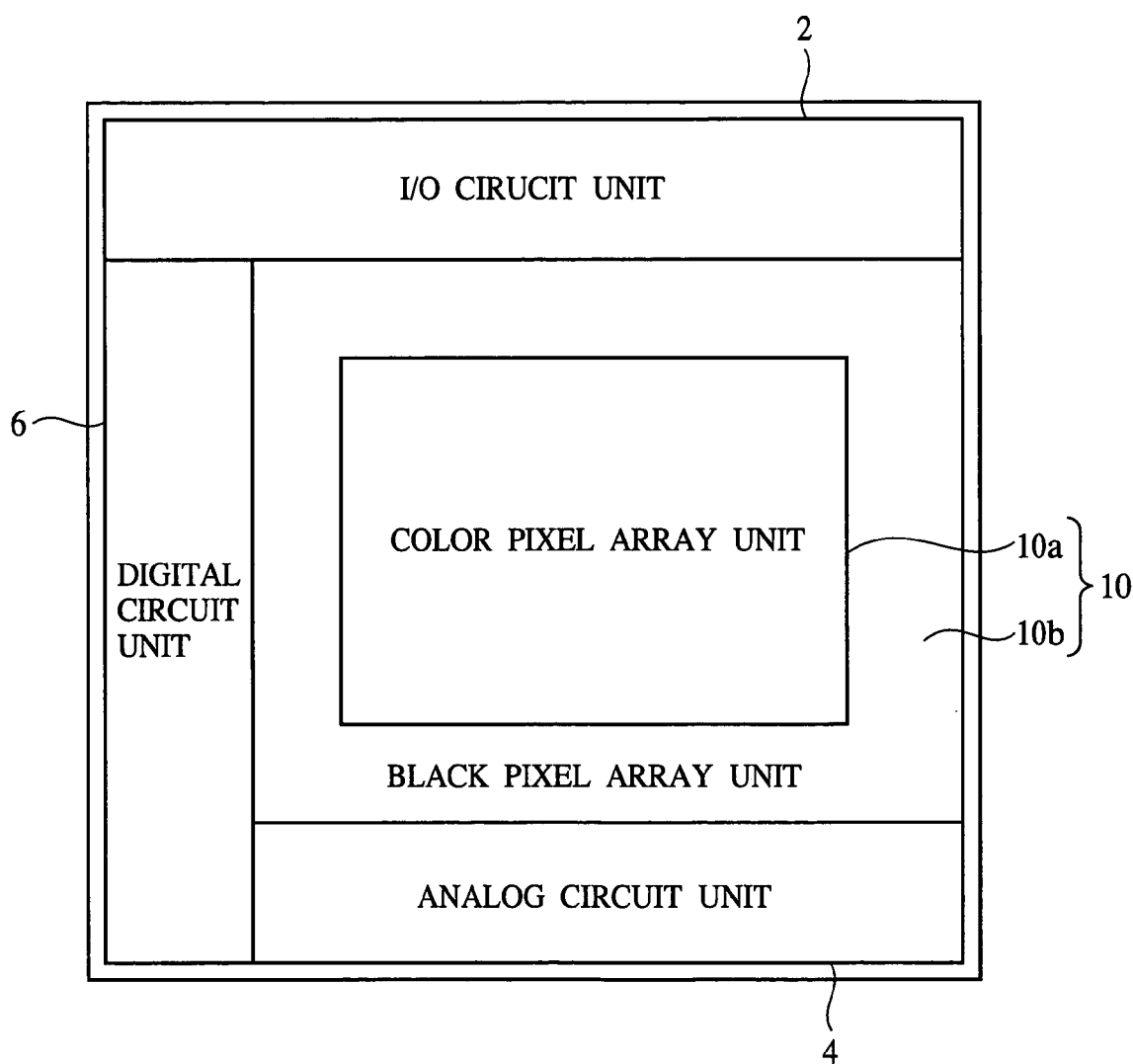
FIG. 1 is a plan view of the solid-state image sensor according to a first embodiment of the present invention, which shows a chip image.
Figure 2:
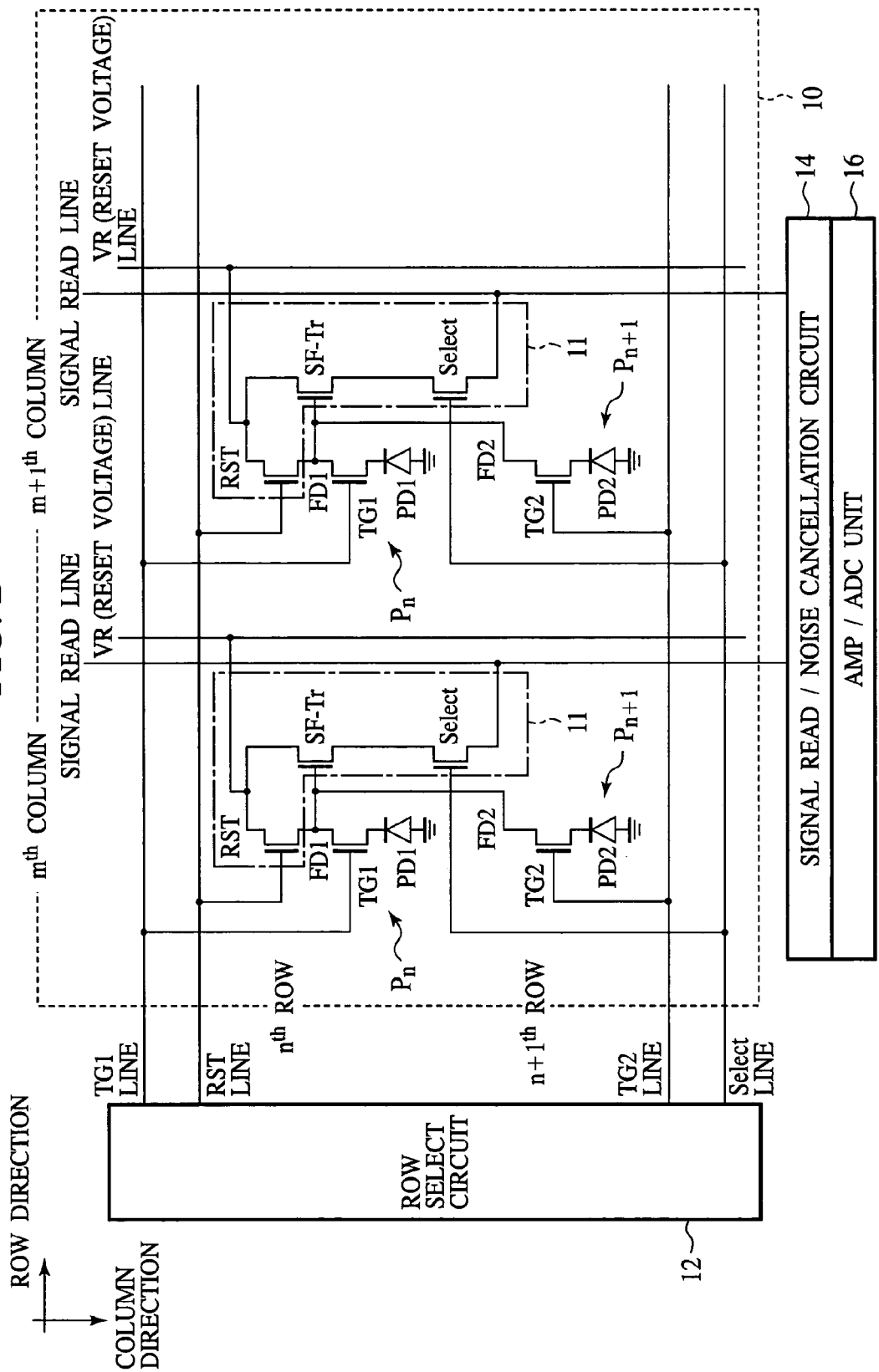
FIG. 2 is a circuit diagram of the pixel array unit of the solid-state image sensor according to the first embodiment of the present invention.
Figure 8:
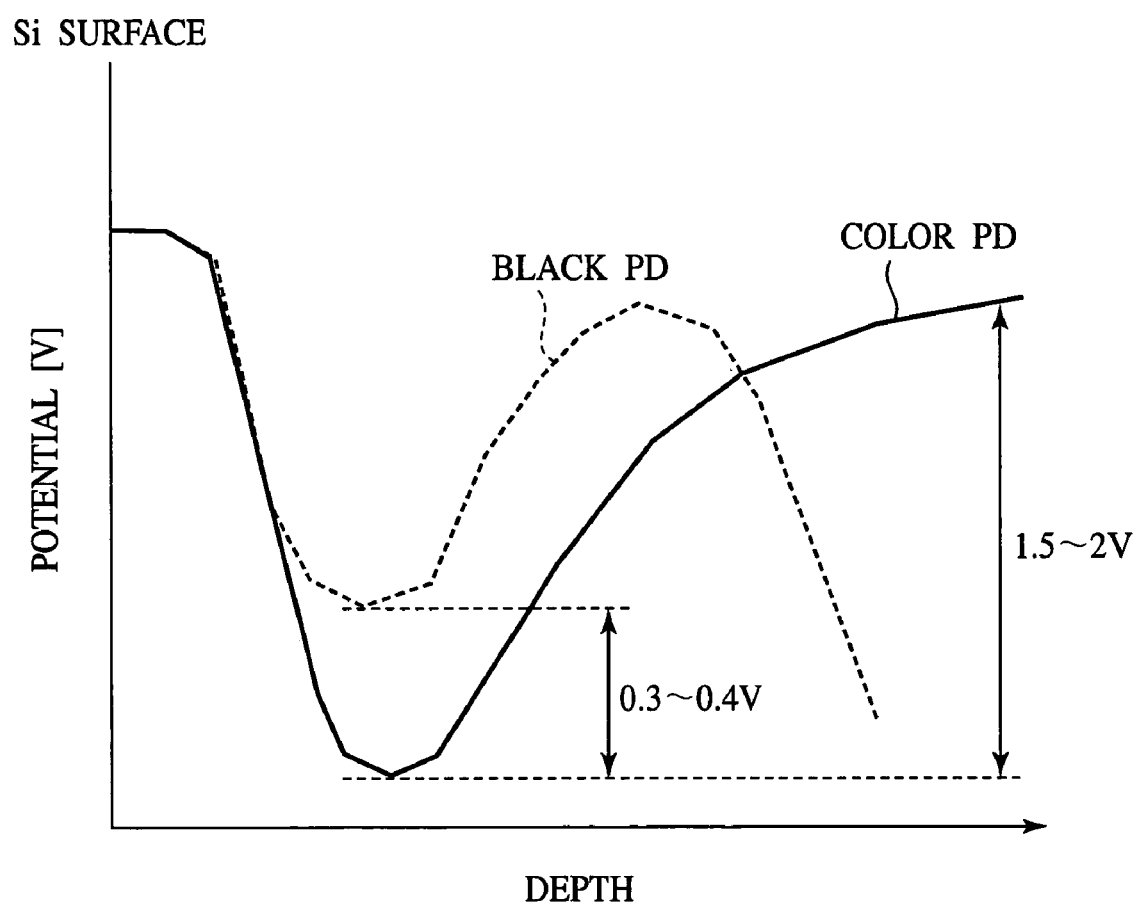
FIG. 8 is a graph of depth-wise changes of the potential of the photodiode formed region of the solid-state image sensor according to the first embodiment of the present invention.
Figure 9A:
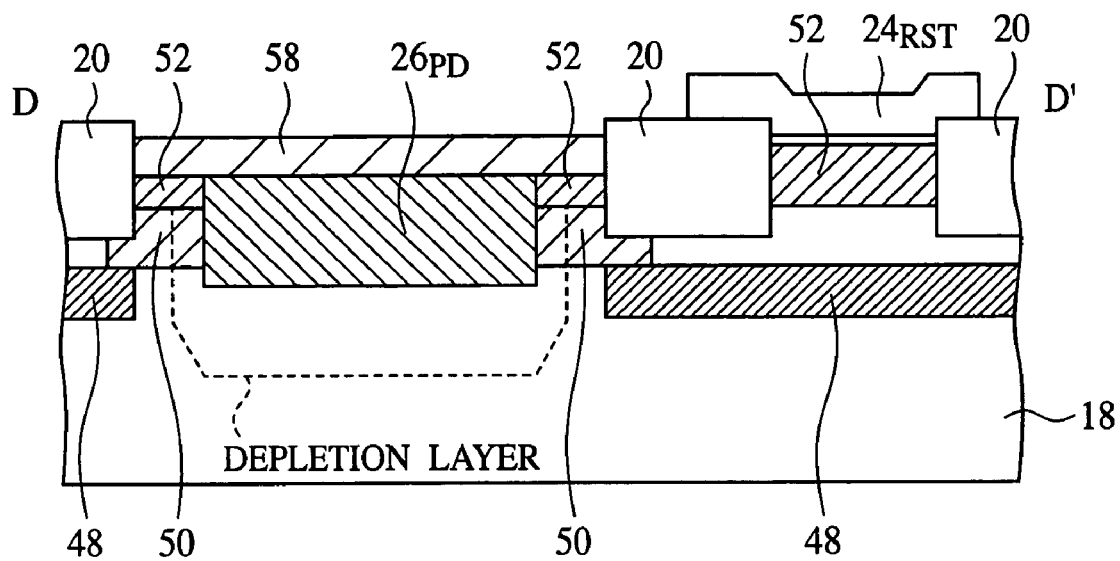
FIGS. 9A and 9B are views showing extensions of the depletion layer of the photodiode.
Figure 9B:
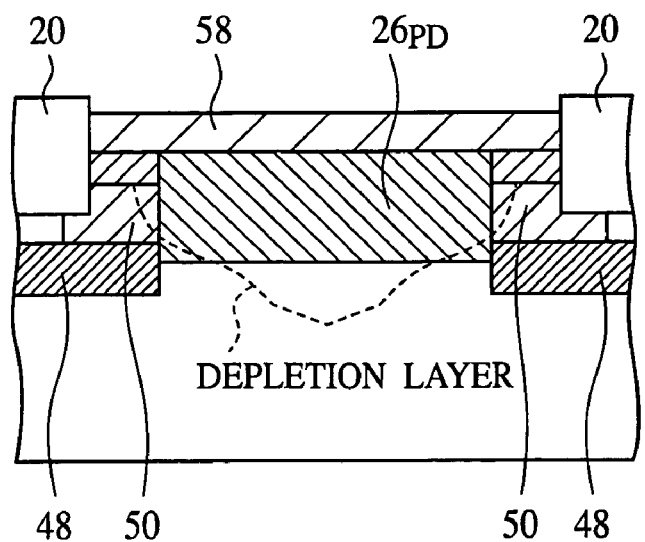
Figure 11A:
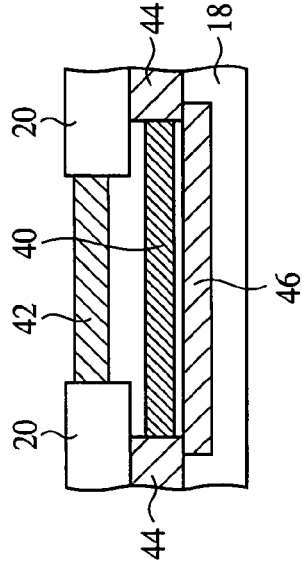
Figure 11B:
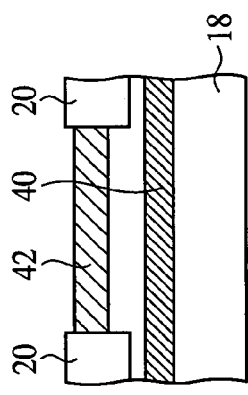
Figure 11C:
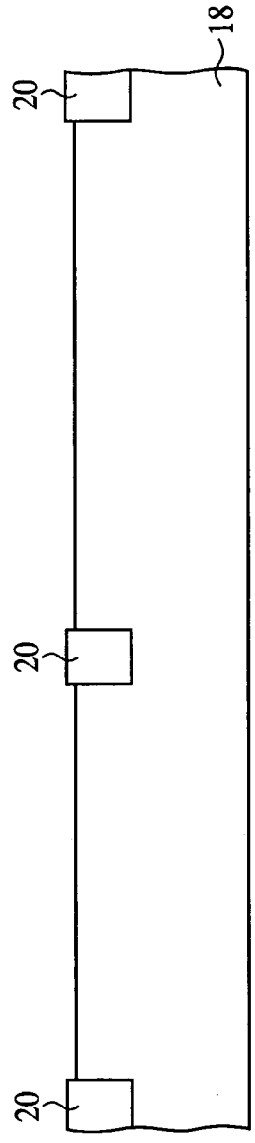
Figure 11D:
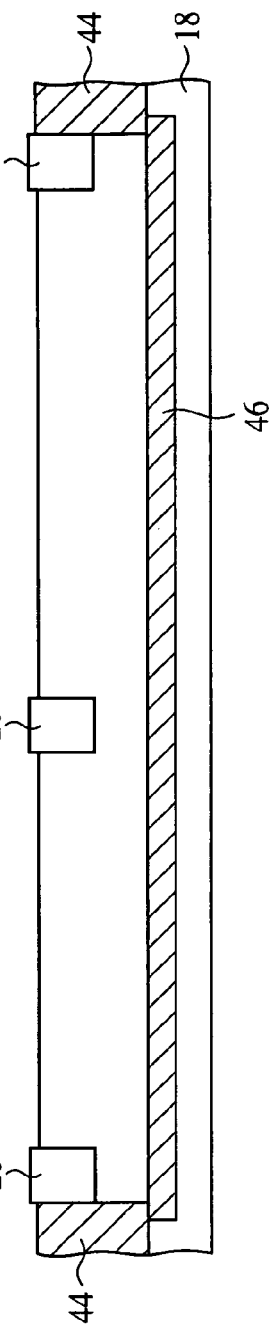
Figure 12A:
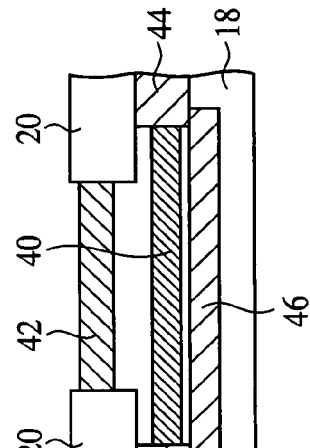
Figure 12B:
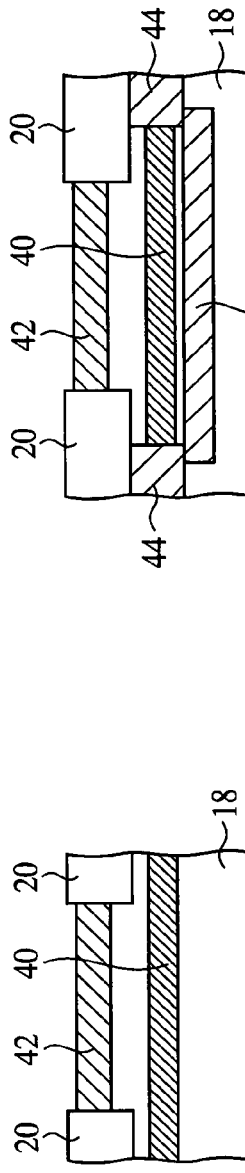
Figure 12C:
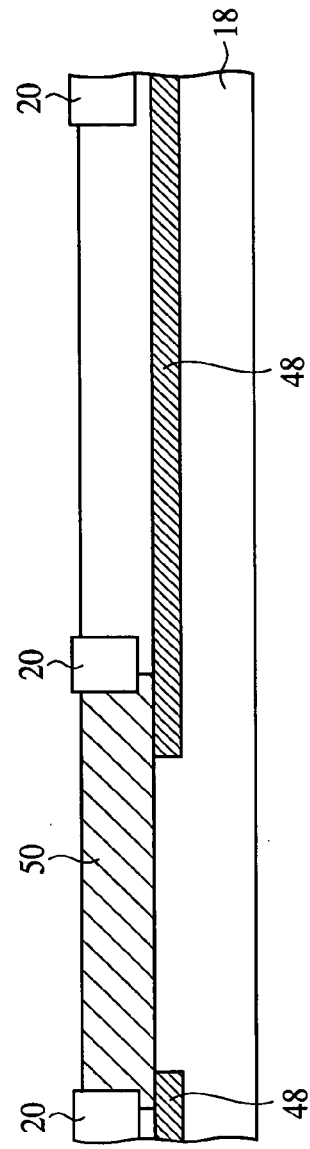
Figure 12D:
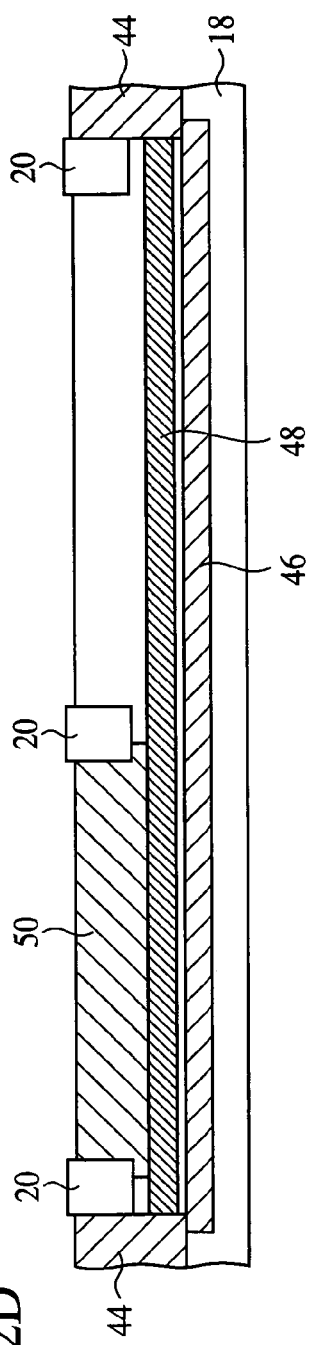
Figure 13A:
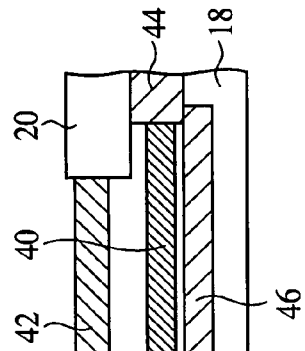
Figure 13B:
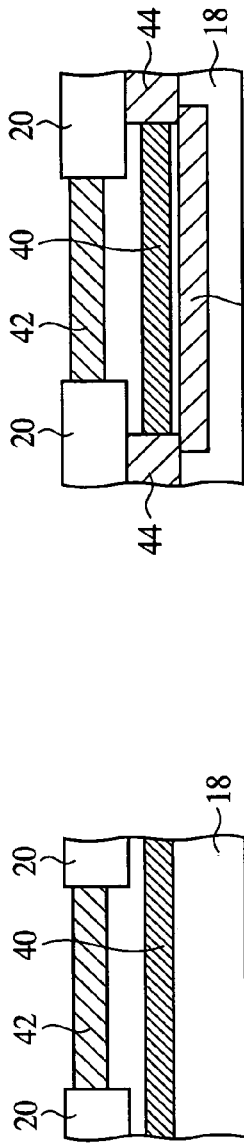
Figure 13C:
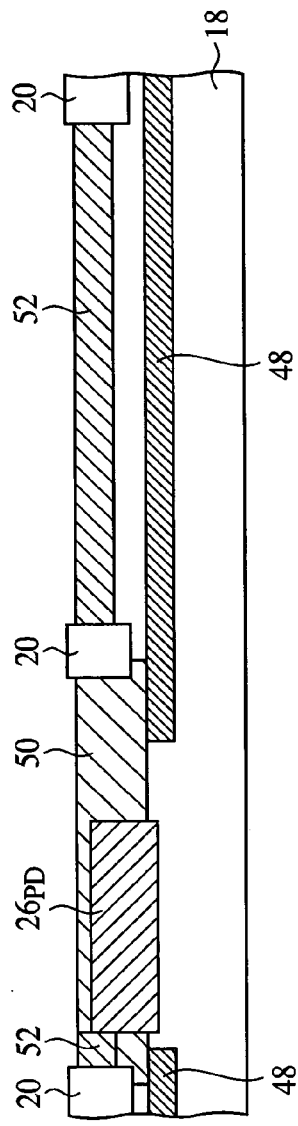
Figure 13D:
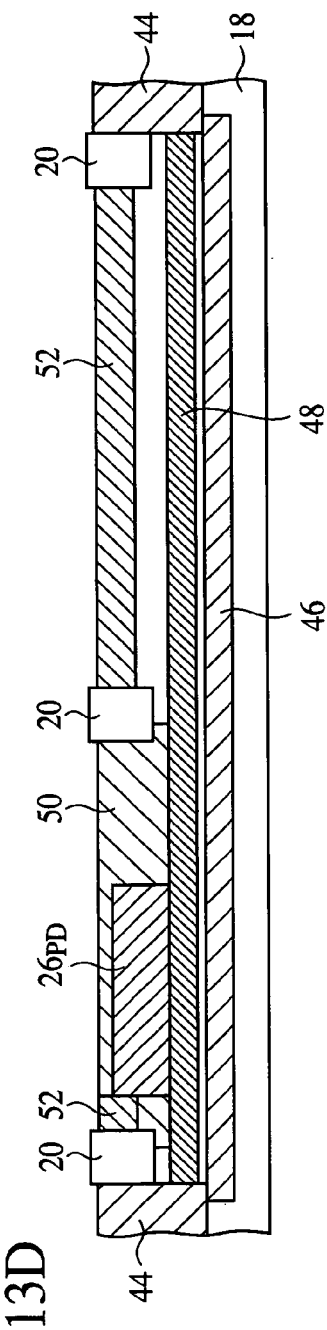
Figure 14A:
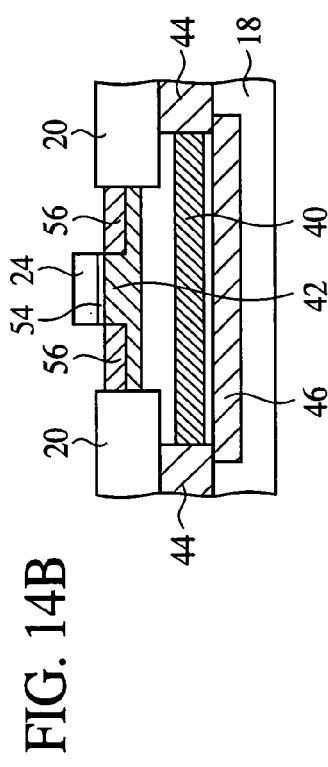
Figure 14B:
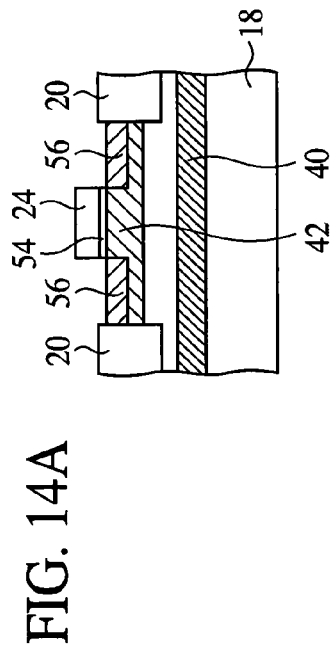
Figure 14C:
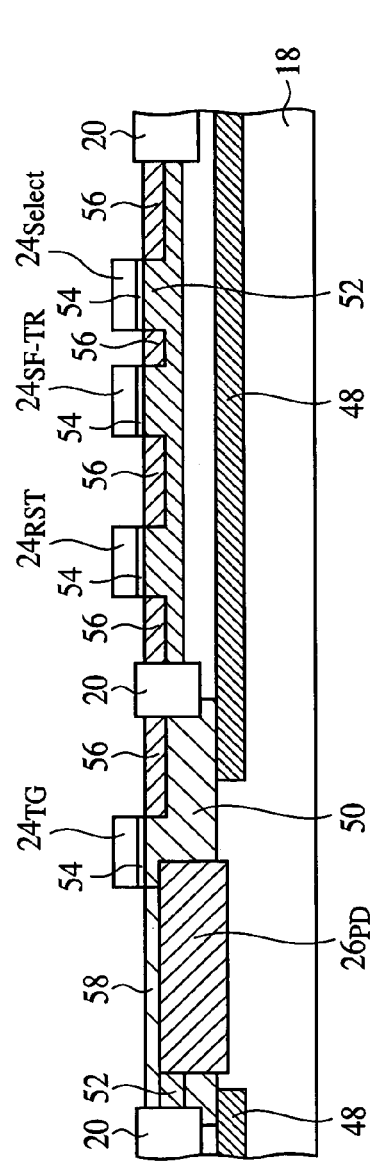
Figure 14D:
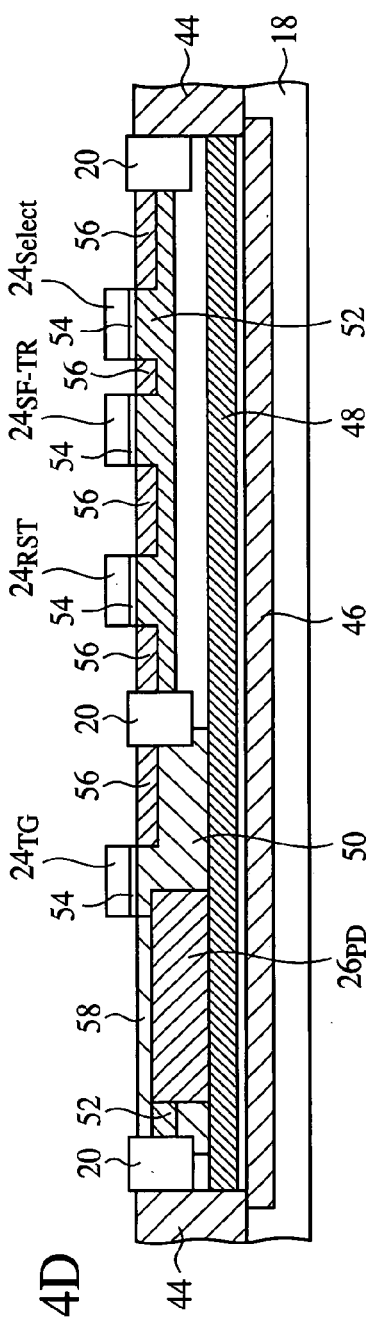
Figure 15A:
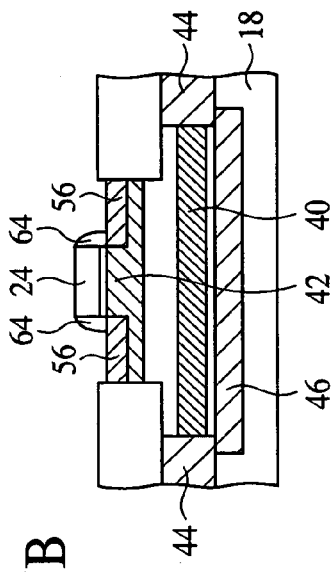
Figure 15B:
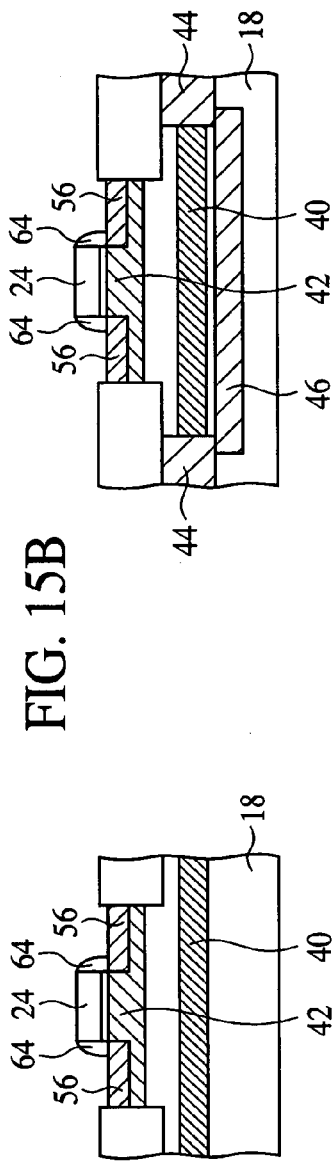
Figure 15C:
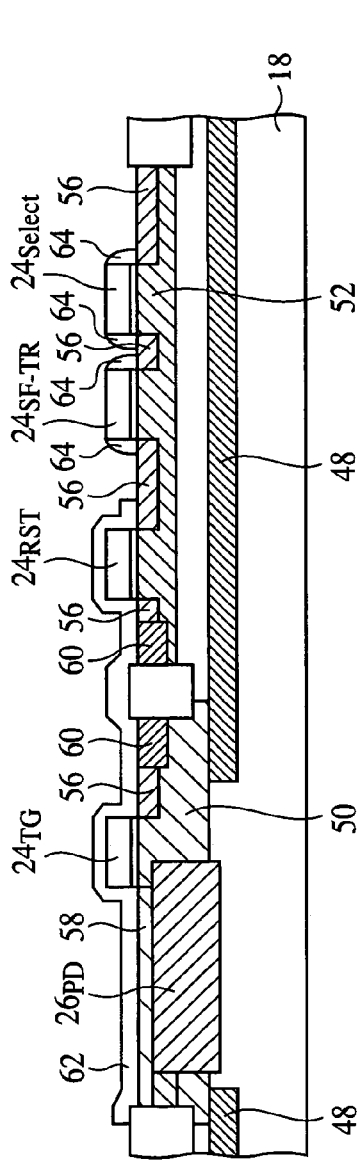
Figure 15D:
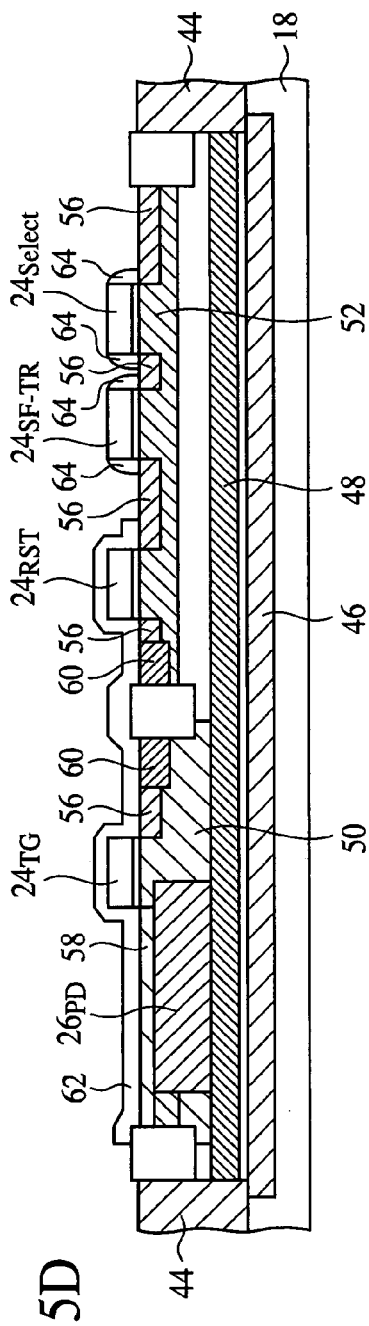
Figure 18:
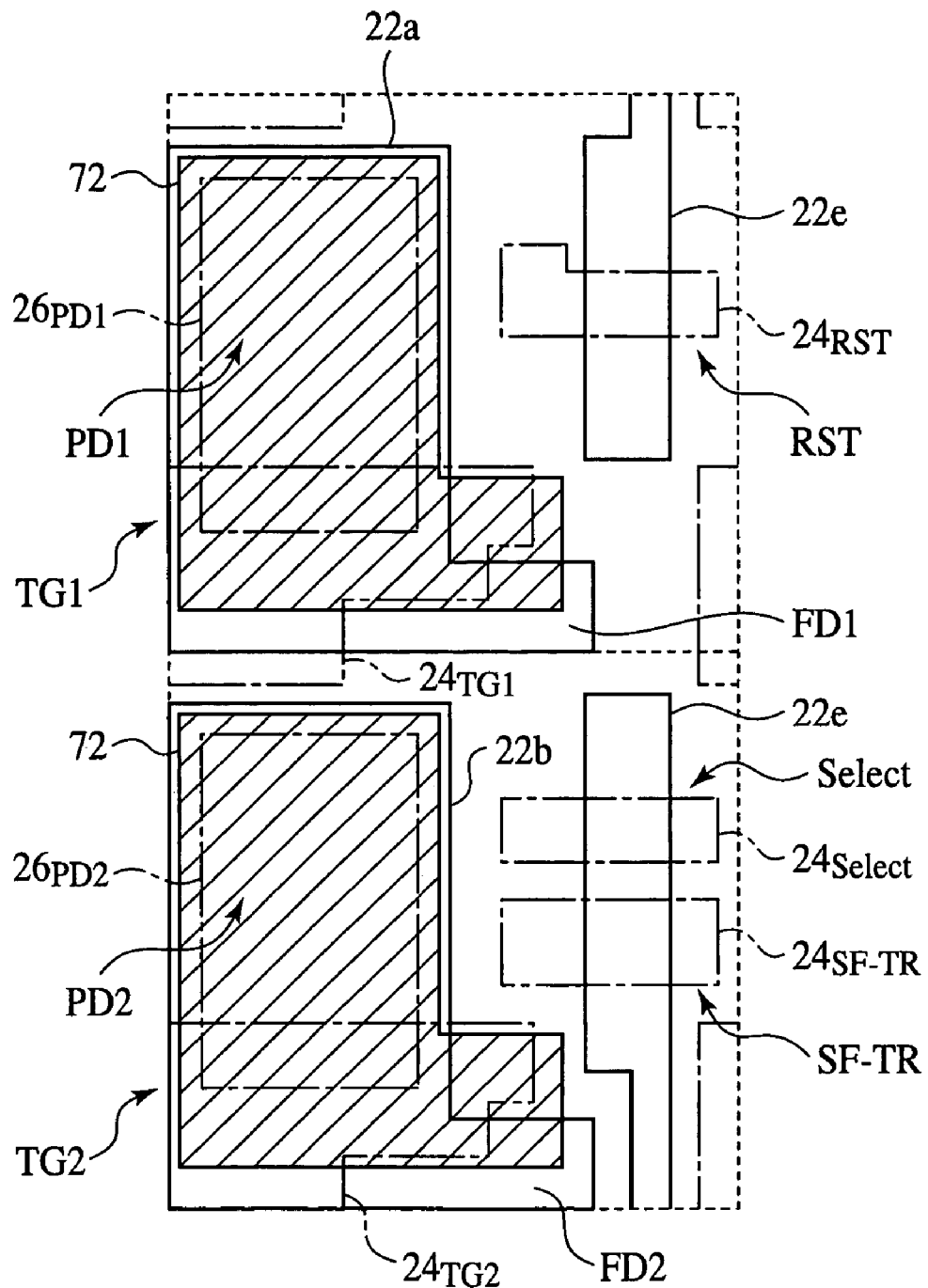
FIGS. 18–20 are plan views of the solid-state image sensor according to the first embodiment of the present invention in the steps of the method for fabricating the same, which show the method.
Figure 19:
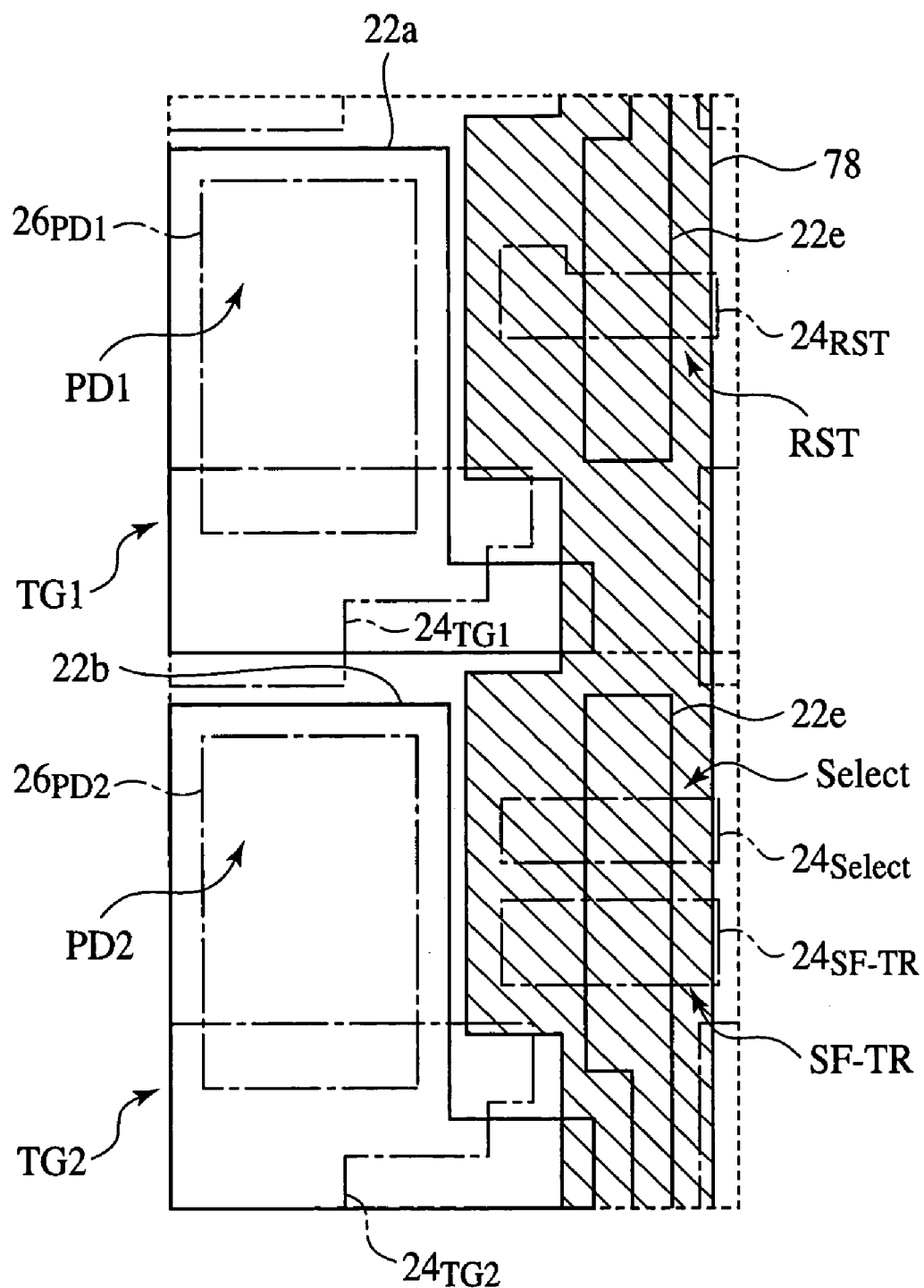
Figure 20:
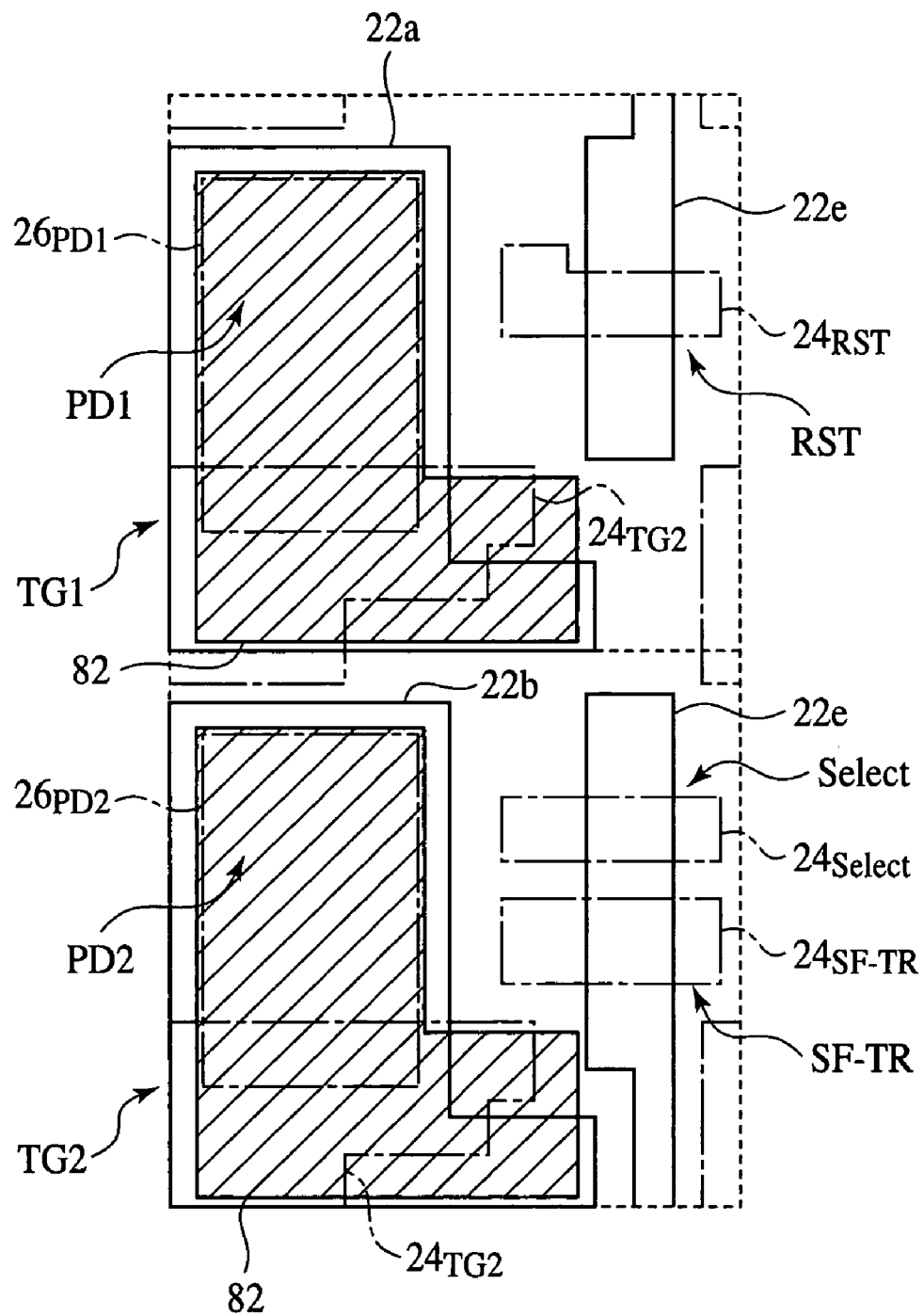

FIG. 1 is a plan view of a chip image of the solid-state image sensor according to the present embodiment. FIG. 2 is a circuit diagram of the pixel array unit of the solid-state image sensor according to the present embodiment. FIGS. 3–6 are plan views of the solid-state image sensor according to the present embodiment, which show the structure thereof. FIGS. 7A–7B are diagrammatic sectional views of the solid-state image sensor according to the present embodiment, which show the structure thereof. FIG. 8 is a graph of depth-wise changes of the potential of the region for a photodiode formed in of the solid-state image sensor according to the present embodiment. FIGS. 9A and 9B are views of the extension of the depletion layer of the photodiode. FIGS. 10A–17D are sectional views of the solid-state image sensor according to the present embodiment in the steps of the method for fabricating the same, which show the method. FIGS. 18–20 are plan views of the solid-state image sensor according to the present embodiment, which show the method for fabricating the solid-state image sensor according to the present embodiment.

First, the structure of the solid-state image sensor according to the present embodiment will be explained with reference to FIGS. 1 to 9B.

FIG. 1 is a plan view of the chip image of the solid-state image sensor according to the present embodiment. As shown in FIG. 1, a black pixel array unit 10b is disposed around a color pixel array unit 10a. In the present specification, the color pixel array unit 10a and the black pixel array unit 10b are often collectively called a pixel array unit 10. Around the black pixel array unit 10b, an I/O circuit unit 2, an analog circuit unit 4, a digital circuit unit 6 are disposed. In the present specification, the I/O circuit 2, the analog circuit unit 4 and the digital circuit unit 6 are often collectively called a peripheral circuit unit.

In the pixel array unit 10, a plurality of pixels each including a photodiode PD which is photoelectric conversion means and a transfer transistor TG which transfers signal charges generated by the photodiode, and a read transistor unit is disposed common between column-wise adjacent pixels. The read transistor unit comprises a source follower transistor SF-Tr, a reset transistor RST and a select transistor SELECT. The source follower transistor SF-Tr converts signal charges transferred from the photo diode through the transfer transistor TG to voltage signals for output. The reset transistor RST resets the input terminal of the source follower transistor SF-Tr. The select transistor SELECT reads signals outputted by the source follower transistors SF-Tr.

Next, the circuit structure of the pixel array unit will be explained with reference to FIG. 2. In FIG. 2, the pixel array unit 10 is represented as a unit of 2×2 pixels.

The pixels $P_n$ positioned in an $n^{th}$ raw of the column-wise adjacent pixels each includes a photodiode PD1 and a transfer transistor TG1. The pixels $P_{n+1}$ positioned in an $n+1^{th}$ row each includes a photodiode PD2 and a transfer transistor TG2. The pixels $P_n$, $P_{n+1}$ each include the photodiode and the transfer transistor TG, and the pixels $P_n$, $P_{n+1}$ include the read transistor unit (the reset transistor RST, the select transistor SELECT and the source follower transistor SF-Tr) 11 commonly therebetween.

The cathode terminal of the photodiode PD1 of the pixel $P_n$ positioned in the $n^{th}$ row is connected to the source terminal of the transfer transistor TG1. The anode terminal of the photodiode PD1 is grounded. The drain terminal of the transfer transistor TG1 is connected to the source terminal of the reset transistor RST and the gate terminal of the source follower transistor SF-Tr. In the region where the drain terminal of the transfer transistor TG1, the source terminal of the reset transistor RST and the gate terminal of the source follower transistor SF-TR are connected, a floating diffusion FD1 for storing charges transferred from the photodiode PD1 is present. The source terminal of the source follower transistor SF-Tr is connected to the drain terminal of the select transistor SELECT.

The cathode terminal of the photodiode PD2 of the pixel $P_{n+1}$ positioned in the $n+1^{th}$ row is connected to source terminal of the transfer transistor TG2. The anode terminal of the photodiode PD2 is grounded. The drain terminal of the transfer transistor TG2 is connected to the source terminal of the reset transistor RST and the gate terminal of the source follower transistor SF-Tr. In the region where the drain terminal of the transfer transistor TG2, the source terminal of the reset transistor RST and the gate terminal of the source follower transistor SF-TR are connected, a floating diffusion FD2 for storing charges transferred from the photodiode PD2 is present. The floating diffusion FD2 is connected to the floating diffusion FD1 by an interconnection.

The row-wise adjacent pixels are respectively connected to a reset line (RST) commonly connecting the gate terminals of the reset transistors RST. The row-wise adjacent pixels are respectively connected to a transfer gate (TG) line (TG1 line) commonly connecting the gate terminals of the transfer transistors TG1 of the pixels $P_n$ positioned in the $n^{th}$ row. The row-wise adjacent pixels are respectively connected to a TG line (TG2 line) commonly connecting the gate terminals of the transfer transistors TG of the pixels $P_{n+1}$ positioned in the $n+1^{th}$ row.

The column-wise adjacent pixels are respectively connected to a signal read line commonly connecting the source terminals of the select transistors SELECT. The column-wise adjacent pixels are respectively connected to a reset voltage (VR) line commonly connecting the drain terminals of the reset transistors RST and the drain terminals of the source follower transistors SF-Tr.

The RST lines, the Select lines, the TG1 lines and the TG2 lines are respectively connected to a row selecting circuit 12. The signal read lines are connected to a signal read/noise cancellation circuit 14. The signal read/noise cancellation circuit 14 is connected to an AMP/ADC unit 16 including amplifiers and AD converters disposed for the respective columns. The VR lines are connected to a power source of the substantially the source power or a power source having the source power lowered inside the chip. A row selection circuit 12, the signal read/noise cancellation circuit 14 and the AMP/ADC unit 16 are formed in the peripheral circuit unit 8.

Then, the layout of the respective elements of the pixel array unit will be explained with reference to FIGS. 3 to 6.

Figure 3:
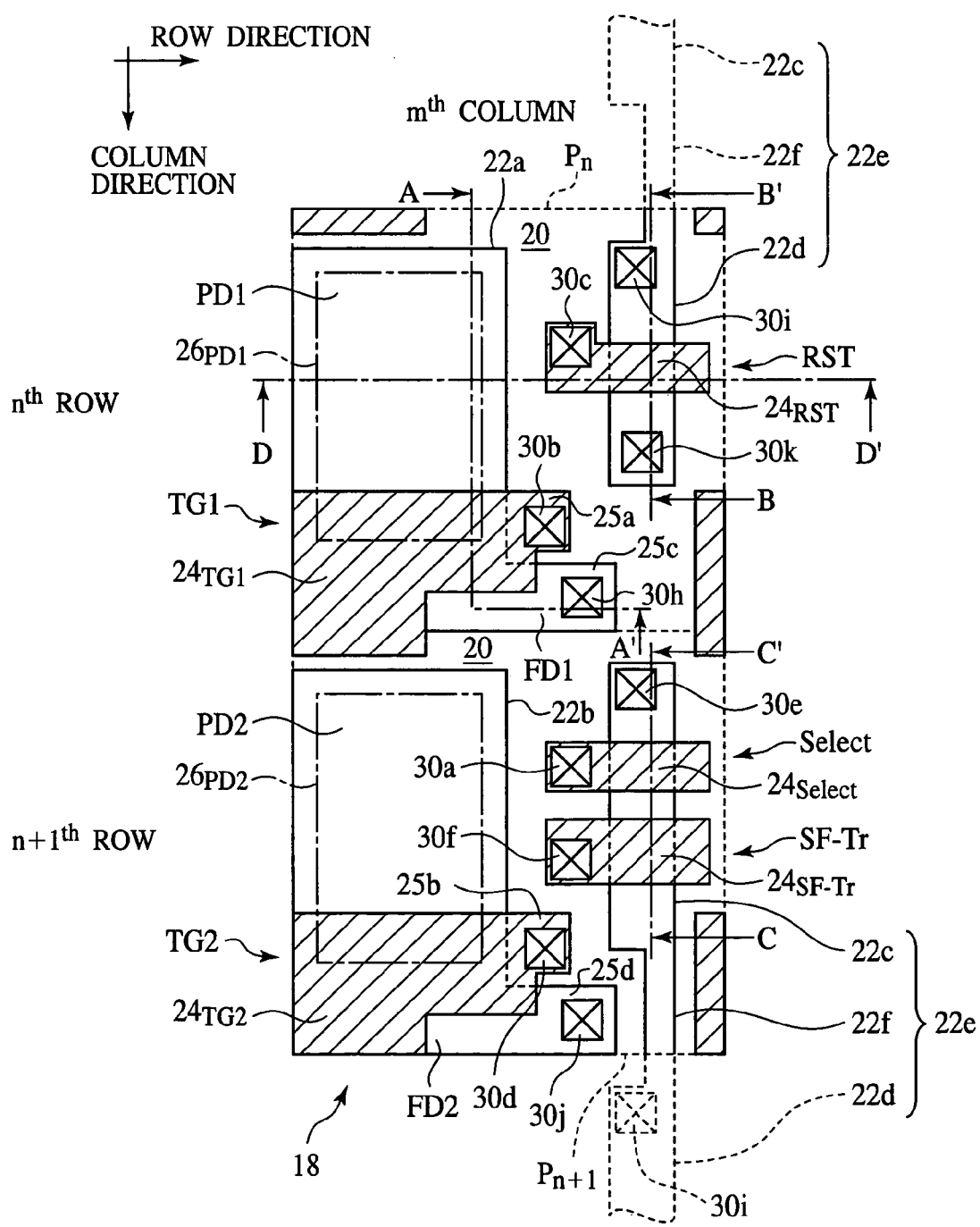
FIGS. 3–6 are plan views of the solid-state image sensor according to the first embodiment of the present invention, which shows a structure thereof.
Figure 4:
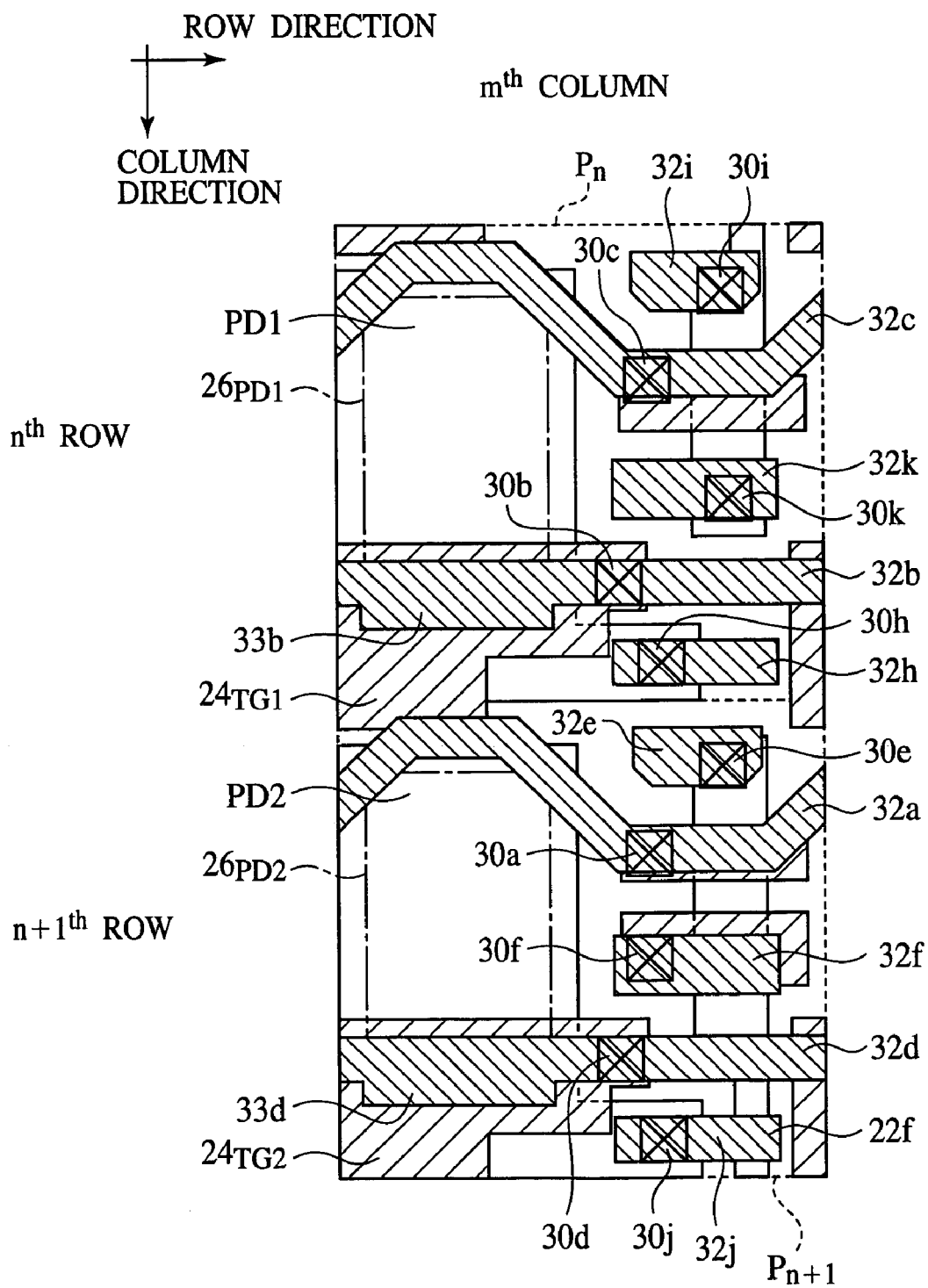
Figure 5:
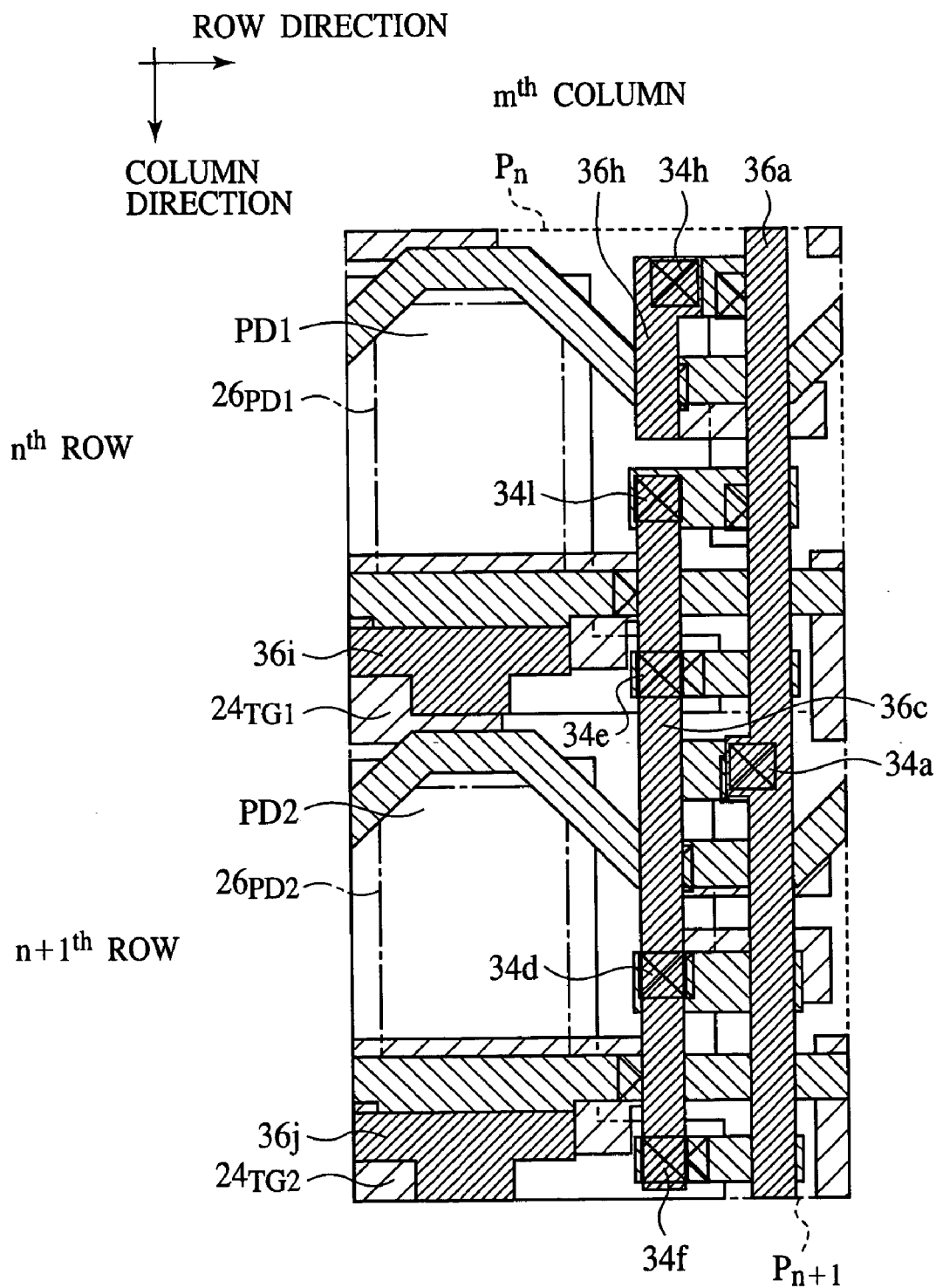
Figure 6:
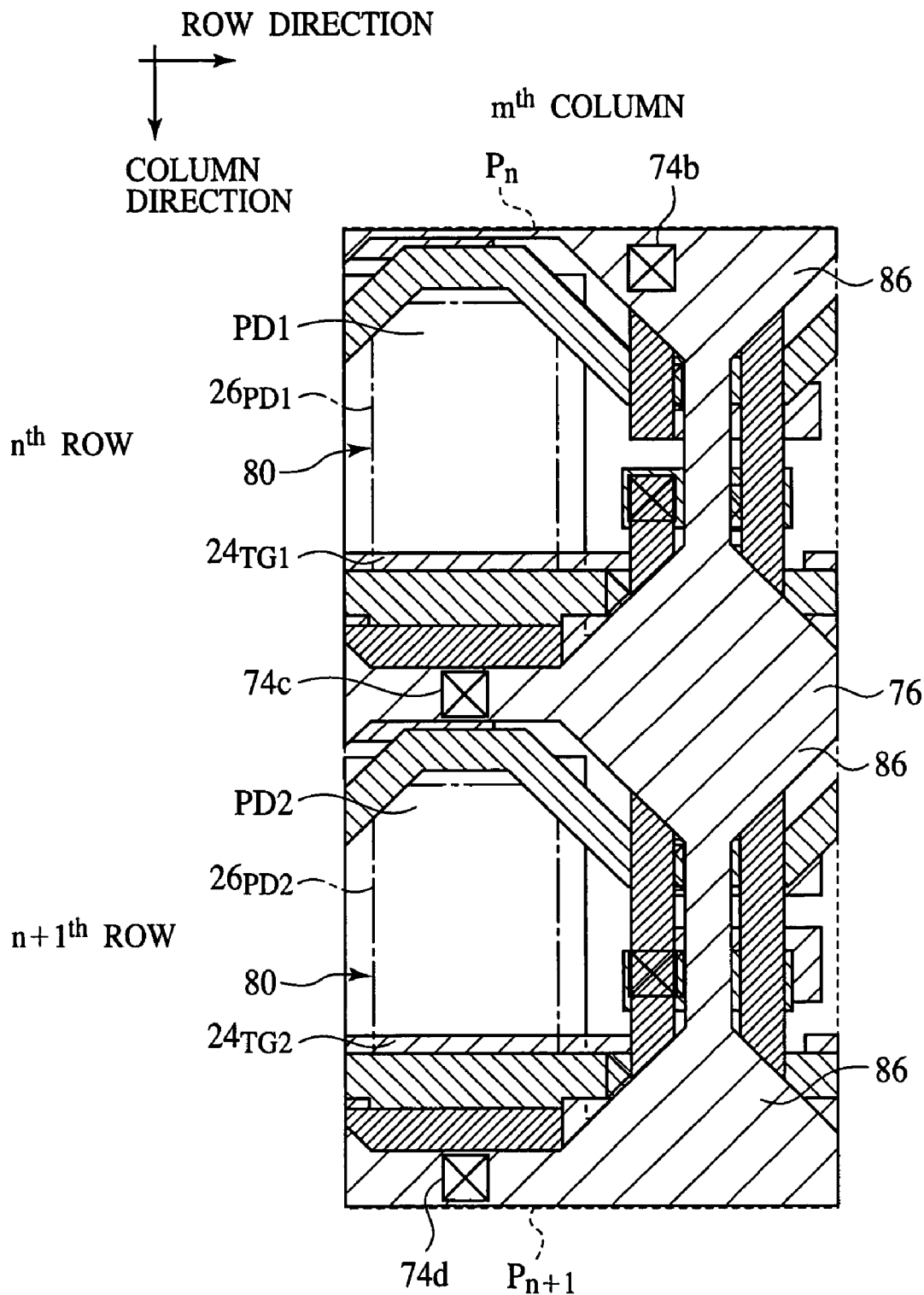

FIG. 3 is a plan view of the active regions and the layout of the gate interconnections in the pixel array unit of the solid-state image sensor according to the present embodiment. FIG. 4 is a plan view of the layout of a first metal interconnection layer in the pixel array unit of the solid-state image sensor according to the present embodiment. FIG. 5 is a plan view of the layout of a second metal interconnection layer in the pixel array unit of the solid-state image sensor according to the present embodiment. FIG. 6 is a plan view of the layout of a third metal interconnection layer in the pixel array unit of the solid-state image sensor according to the present embodiment.

In FIGS. 3 to 6, a plurality of pixels arranged in a matrix in the pixel array unit 10 are represented by the pixel $P_n$ in an $n^{th}$ row and a pixel $P_{n+1}$ in an $n+1^{th}$ row, which have the read transistor unit 11 made common therebetween and are adjacent to each other in an $m^{th}$ column. Actually in the pixel unit 10, sets of the column-wise adjacent pixels $P_n$, $P_{n+1}$ having the common read transistor unit 11 are arranged at a 1-pixel pitch in row-wise and at a 2-pixel pitch in column-wise.

As shown in FIG. 3, the active regions 22a–22f defined by a device isolation film 20 are formed on a silicon substrate 18. The active regions 22 of the pixels $P_n$, $P_{n+1}$ include a PD1/TG1/FD1 region 22a, a PD2/TG2/FD2 region 22b and a read transistor region 22e.

The pixel $P_n$ in the $n^{th}$ row has the PD1/TG1/FD1 region 22a containing a wide rectangular region which is longer column-wise and a projected region which is continuous to the wide rectangular region and projected from one of the column-wise parallel sides of the wide rectangular region. In the PD1/TG1/FD1 region 22a, the photodiode PD1, the transfer transistor TG1 and floating diffusion FD1 are formed. A contact part 25c is provided at the end of the projected region of the PD1/TG1/FD1 region 22a. The contact part 25c is electrically connected to an FD-SF interconnection 36c (see FIG. 5) for electrically interconnecting the floating diffusion FD1 and the floating diffusion FD2 with each other (which will be described later) via a contact plug 30h, lead interconnection 32h (see FIG. 4) and a contact plug 34e (see FIG. 5).

The pixel $P_{n+1}$ in the $n^{th}$ row has the PD2/TG2/FD2 region 22b containing a wide rectangular region which is longer column-wise and a projected region which is continuous to the wide rectangular region and projected from one of the column-wise parallel sides of the wide rectangular region. In the PD2/TG2/FD2 region 22b, the photodiode PD2, the transfer transistor TG2 and floating diffusion FD2 are formed. A contact part 25d is provided at the end of the projected region of the PD2/TG2/FD2 region 22b. The contact part 25d is electrically connected to an FD-SF interconnection 36c (see FIG. 5) for electrically interconnecting the floating diffusion FD1 and the floating diffusion FD2 with each other (which will be described later) via a contact plug 30j, a lead interconnection 32j (see FIG. 4) and a contact plug 34f (see FIG. 5).

The PD1/TG1/FD1 region 22a and the PD2/TG2/FD2 region 22b have substantially the same configuration. The position of the PD1/TG1/FD1 region 22a in the pixel $P_n$ and the position of the PD2/TG2/FD2 region 22b in the pixel $P_{n+1}$ are substantially the same. That is, the PD1/TG1/FD1 region 22a and the PD2/TG2/FD2 region 22b are spaced from each other column-wise substantially by a 1-pixel pitch.

In the pixel $P_n$ in the $n^{th}$ row, the RST region 22d where the reset transistor RST of the common read transistor unit 11 is disposed is provided. The RST region 22d is disposed on the side of one of the sides of the pixel $P_n$, which is column-wise parallel with the PD1/TG1/FD1 region 22a. The RST region 22d has a rectangular shape which is longer column-wise.

In the pixel $P_{n+1}$ in the $n+1^{th}$ row, a Select/SF-Tr region 22c where the select transistor SELECT and the source follower transistor SF-Tr are formed is disposed. The Select/SF-Tr region 22c is disposed on the side of one of the parallel sides of the pixel $P_{n+1}$, which is column-wise parallel with the PD2/TG2/FD2. The Select/SF-Tr region 22c has a rectangular shape which is longer column-wise.

The Select/SF-Tr region 22c and the RST region 22d are disposed on the same row-wise side with respect to the PD1/TG1/FD1 region 22a and the PD2/TG2/FD2 region 22b.

The pixel $P_{n-1}$ (not shown) in the $n-1^{th}$ row which is adjacent to the pixel $P_n$ has the same active regions as the pixel $P_{n+1}$. The pixel $P_{n+2}$ (not shown) in the $n+2^{th}$ row which is adjacent to the pixel $P_{n+1}$ has the same active regions as the pixel $P_n$. The RST region 22d of the pixel $P_n$ is integrally continuous to the Select/SF-Tr region 22c of the pixel $P_{n-1}$ via the column-wise long active region 22f. The Select/SF-Tr region 22c of the pixel $P_{n+1}$ is integrally continuous to the RST region 22d of the pixel $P_{n+2}$ via the column-wise long active region 22f. Thus, over the pixel $P_{1-1}$ and the pixel $P_n$, the read transistor region 22e, which is one stretch of active region formed of the integrally continuous Select/SF-Tr region 22c and the RST region 22d, is provided. Similarly, over the pixels $P_{n+1}$, $P_{n+2}$, the read transistor region 22e, which is one stretch of active region formed of the integrally continuous Select/SF-Tr region 22c and the RST region 22d is provided.

In the wide rectangular region of the PD1/TG1/FD1 region 22a in the pixel $P_n$ in the $n^{th}$ row, the photodiode PD1 is formed. Near the end of the photodiode PD1, which is on the lower side of the PD1/TG1/FD1 region 22a as viewed in the drawing, the gate electrode $24_{TG1}$ of the transfer transistor TG1 is formed bridging row-wise the PD1/TG1/FD1 region 22a. The end of the gate electrode $24_{TG1}$ on the side of the photodiode PD1 overlaps the end of the buried N-type layer $26_{PD1}$ of the photodiode PD1. The gate electrode $24_{TG1}$ has a contact part 25a projected from the end of the gate electrode $24_{TG1}$ on the side of the RST region 22d. The TG1 line 32b (see FIG. 4) is electrically connected to the contact part 25a via a contact plug 30b.

In the wide rectangular region of the PD2/FG2/FD2 region 22b in the pixel $P_{n+1}$ in the $n+1^{th}$ row, the photodiode PD2 is formed. Near the end of the photodiode PD2, which is on the lower side of the PD2/TG2/FD2 region 22b as viewed in the drawing, the gate electrode $24_{TG2}$ of the transfer transistor TG2 is formed, bridging row-wise the PD2/TG2/FD2 region 22b. The end of the gate electrode $24_{TG2}$ on the side of the photodiode PD2 overlaps the end of the buried N-type layer $26_{PD2}$ of the photodiode PD1. The gate electrode $24_{TG2}$ has a contact part 25b projected from the end of the gate electrode $24_{TG2}$ on the side of the Select/SF-Tr region 22c. The TG2 line 32d (see FIG. 4) is electrically connected to the contact part 25b via a contact plug 30d.

The photodiode PD1 and the photodiode PD2 have substantially the same configuration. The gate electrode $24_{TG1}$ and the gate electrode $24_{TG2}$ respectively including the contact parts 25a, 25b have substantially the same configuration. The positional relation of the gate electrode $24_{TG1}$ with the photodiode PD1 and the positional relationship of the gate electrode $24_{TG2}$ with the photodiode PD2 are substantially the same. That is, the photodiode PD1 and the photodiode PD2 are spaced from each other column-wise substantially at a 1-pixel pitch, and the gate electrode $24_{TG1}$ and the gate electrode $24_{TG2}$ are spaced from each other column-wise substantially at a 1-pixel pitch. The overlap of the photodiode $24_{TG1}$ over the buried N-type layer $26_{PD2}$ and the overlap of the gate electrode $24_{TG2}$ over the buried N-type layer $26_{PD2}$ are substantially the same. That is, the area of the part of the N-type buried layer $26_{PD1}$, which is immediately below the end of the gate electrode $24_{TG1}$ and the area of the part of the N-type buried layer $26_{PD2}$, which is immediately below the end of the gate electrode $24_{TG2}$ are substantially equal to each other.

Over the RST region 22d in the pixel $P_n$ in the $n^{th}$ row, the gate electrode $24_{RST}$ of the reset transistor RST is formed, bridging the RST region 22d row-wise.

Over the Select/SF-Tr region 22c in the pixel $P_{n+1}$ in the $n+1^{th}$ row, the gate electrode $24_{Select}$ of the select transistor SELECT and the gate electrode $24_{SF-Tr}$ of the source follower transistor SF-Tr are formed, respectively bridging the Select/SF-Tr region 22c row-wise. The gate electrode $24_{Select}$ and the gate electrode $24_{SF-TR}$ are arranged column-wise from the $n+1^{th}$ row to the $n+2^{th}$ row in the stated order.

As described above, the RST region 22d in the pixel $P_n$ is integrally continuous, via the column-wise long active region 22f, to the Select/SF-Tr region 22c of the pixel $P_{n-1}$ in the $n-1^{th}$ row, which is adjacent to the pixel $P_n$. Thus, the drain region of the reset transistor RST in the pixel $P_n$ and the drain region 22f of the source follower transistor SF-Tr in the pixel $P_{1-1}$ are integrally continuous via the active region 22f. That is, the drain region of the reset transistor RST in the pixel $P_n$ and the drain region of the source follower transistor RST in the pixel $P_{n-1}$ are formed of a common impurity diffused region. The Select/SF-Tr region 22c in the pixel $P_{n+1}$ is integrally continuous, via the active region 22f, to the RST region 22d in the pixel $P_{n+2}$ in the n+2$^{th}$ row adjacent to the pixel $P_{n+1}$. That is, the drain region of the source follower transistor SF-Tr in the pixel $P_{n+1}$ and the drain region of the rest transistor RST in the pixel $P_{n+2}$ are formed of a common impurity diffused region.

As described above, for the pixels $P_n$, $P_{n+1}$ adjacent to each other in the m$^{th}$ column, the common read transistor unit (the Select transistor SELECT, the source follower transistor SF-Tr and the reset transistor RST) is formed in the region between the photodiodes PD1, PD2 in the m$^{th}$ column and the photodiodes PD1, PD2 in the m+1$^{th}$ column.

The floating diffusion FD1 is formed in the part of the PD1/TG1/FD1 region 22a between the gate electrode $24_{TG1}$ and the contact part 25c. The floating diffusion FD2 is formed in the part of the PD2/FG2/FD2 region 22b between the gate electrode $24_{TG2}$ and the contact part 25d. Thus, the floating diffusion FD1 and the floating diffusion FD2 are formed in the active regions which are substantially the same shape. The position of the floating diffusion FD1 in the pixel $P_n$ and the position of the floating diffusion FD2 in the pixel $P_{n+1}$ are substantially the same. That is, the floating diffusion FD1 and the floating diffusion FD2 are spaced from each other column-wise substantially at a 1-pixel pitch.

As shown in FIG. 4, the first metal interconnection layer 32 includes the Select line 32a electrically connected to the gate electrode $24_{Select}$ via the contact plug 30a, the TG1 line 32b electrically connected to the gate electrode $24_{TG1}$ via the contact plug 30b, the RST line 32c electrically connected to the gate electrode $24_{RST}$ via the contact plug 30c, and the TG2 line 32d electrically connected to the gate electrode $24_{TG2}$ via the contact plug 30d. The first metal interconnection layer 32 includes the lead interconnection 32e electrically connected to the source region of the select transistor SELECT via the contact plug 30e, the lead interconnection 32f electrically connected to the gate electrode $24_{SF-Tr}$ via the contact plug 30f, the lead interconnection 32h electrically connected to the floating diffusion FD1 via the contact plug 30h, the lead interconnection 32i electrically connected to the drain region of the reset transistor RST via the contact plug 30i, and the lead interconnection 32k electrically connected to the source region of the reset transistor RST via the contact plug 30k.

The Select line 32a is extended row-wise zigzag, circumventing the photodiodes PD2. That is, the Select line 32a, near one of the row-wise parallel edges of the photodiode PD2, is extended along the edge, spaced at a certain gap. Near the corner of the photodiode PD2, the Select line 32a is extended obliquely to the row-wise direction, a little overlapping the corner of the photodiode PD2.

The RST line 32c is extended row-wise zigzag, circumventing the photodiode PD1. That is, the RST line 32c, near one of the row-wise parallel edges of the photodiode PD1, is extended along the edge, spaced at a certain gap. Near the corner of the photodiode PD1, the RST line 32c is extended obliquely to the row-wise direction, a little overlapping the corner of the photodiode PD1. The pattern shape of the RST line 32c is substantially the same as that of the Select line 32a.

The TG1 line 32b electrically connected to the gate electrode $24_{TG1}$ is extended, overlapping the end of the photodiode PD1 on the side of the gate electrode $24_{TG1}$. The TG1 line 32b has, at the part near the end of the photodiode PD1, a widened part 33b which is widened toward downward as viewed in the drawing.

Similarly, the TG2 line 32d electrically connected to the gate electrode $24_{TG2}$ is extended row-wise, overlapping the edge of the photodiode PD2 on the side of the gate electrode $24_{TG2}$. The TG2 line 32d has a widened part 33d which is widened downward as viewed in the drawing at the part near the edge of the photodiode PD2. The pattern shape of the TG2 line is substantially the same as that of the TG1 line 32B. The overlap of the TG2 line 32d over the end of the photodiode PD2 is substantially equal to the overlap of the TG1 line 32b over the end of the photodiode PD1.

The contact plug 30b electrically connecting the TG1 line 32b to the gate electrode $24_{TG1}$ is connected to the contact part 25a of the gate electrode $24_{TG1}$ projected from the end of the gate electrode $24_{TG1}$ on the side of the RST region 22d. Thus, the contact part 25a of the gate electrode $24_{TG1}$, to which the contact plug 30b is connected, is not formed in the region between the photodiode PD1 and the photodiode PD2 column-wise adjacent to each other.

The contact plug 30d electrically connecting the TG2 line 32d to the gate electrode $24_{TG2}$ is connected to the contact part 25b of the gate electrode $24_{TG2}$ projected from the end of the gate electrode $24_{TG2}$ on the side of the Select/SF-Tr region 22d. Thus, the contact part 25b of the gate electrode $24_{TG2}$, to which the contact plug 30d is connected, is not formed in the region between the photodiode PD1 and the photodiode PD2 column-wise adjacent to each other.

The contact plug 30h electrically connecting the lead interconnection 32h to the floating diffusion FD1 is connected to the contact part 25c provided in the region projected from the PD1/TG1/FD1 region 22a. The contact part 25c of the floating diffusion FD1 is not formed in the region between the photodiode PD1 and the photodiode PD 2.

The contact plug 30j electrically connecting the lead interconnection 32j to the floating diffusion FD2 is connected to the contact part 25d provided in the region projected from the PD2/TG2/FD2 region 22b. The contact part 25d of the floating diffusion FD2 is not formed in the region between the photodiode PD1 and the photodiode PD2 column-wise adjacent to each other.

In the first metal interconnection layer 32, the RST line 32c and the Select line 32a mutually have substantially the same pattern shape, and the TG1 line 32b and the TG2 line 32d mutually have substantially the same pattern shape. Furthermore, the lead interconnections mutually have substantially the same pattern shape as follows. That is, the lead interconnection 32i and the lead interconnection 32e mutually have substantially the same pattern shape. The lead interconnection 32k and the lead interconnection 32f mutually have substantially the same pattern shape. The lead interconnection 32h and the lead interconnection 33j mutually have substantially the same pattern shape. Thus, in the first metal interconnection layer 32, the interconnection layer in the pixel $P_n$ (the RST line 32c, the TG1 line 32b, the lead interconnections 32i, 32k, 32h) and the interconnection layer in the pixel $P_{n+1}$ (the Select line 32a, the TG2 line 32d, the lead interconnections 32e, 32f, 32j) mutually have substantially the same pattern shape.

As shown in FIG. 5, the second metal interconnection layer 36 includes the signal read line 36a electrically connected to the source region of the select transistor SELECT via the contact plug 34a, and an FD-SF interconnection line 36c electrically connected to the gate electrode $24_{SF-Tr}$ of the source follower transistor SF-Tr, the floating diffusion FD1, the floating diffusion FD2 and the source region of the reset transistor RST respectively via the contact plugs 34d, 34e, 34f, 34l. The second metal interconnection layer 36 also includes the lead interconnection 36h electrically connected to the drain region of the reset transistor RST via the contact plug 34h. The second metal interconnection layer 36 includes VR lines 36i, 36j respectively formed above the gate electrodes $24_{TG1}$, $24_{TG2}$ and electrically connected to a VR line 76 (see FIG. 6) via the contact plugs 74c, 74d.

The signal read line 36a and the FD-SF interconnection line 36c are extended respectively column-wise. The lead interconnection 36h is extended column-wise in parallel with the FD-SF connection line 36c.

The signal read line 36a is electrically connected to the source region of the select transistor SELECT via the lead interconnection 32e and the contact plug 34a of the first metal interconnection layer 32.

The FD-SF interconnection line 36c is electrically connected to the gate electrode $24_{SF-Tr}$ of the source follower transistor SF-Tr via the contact plug 30f, the lead interconnection 32f of the first metal interconnection layer 32 and the contact plug 34d. The FD-SF interconnection line 36c is electrically connected to the floating diffusion FD1 via the contact plug 30h, the lead interconnection 32h of the first metal interconnection layer 32 and the contact plug 34e. The FD-SF connection line 36c is electrically connected to the floating diffusion FD2 via the contact plug 30j, the lead interconnection 32j of the first metal interconnection layer 32 and the contact plug 34f. The FD-SF connection line 36c is electrically connected to the source region of the reset transistor RST via the contact plug 30k, the lead interconnection line 32k of the first metal interconnection layer 32 and the contact plug 34l. Thus, the floating diffusion FD1, the floating diffusion FD2, the gate electrode $24_{SF-Tr}$ of the source follower transistor SF-Tr and the source region of the reset transistor RST are electrically connected with each other by the FD-SF interconnection line 36c and the lead interconnections 32f, 32h, 32j, 32k.

The VR line 36i is formed over the gate electrode $24_{TG1}$ below the TG1 line 32b as viewed in the drawing. The pattern of the VR line 36i is a T-shape having a rectangular portion which is longer row-wise along the TG1 line 32b and a rectangular portion projected from the rectangular portion downward as viewed in the drawing. Below the end of the VR line 36i on the side of the TG1 line 32b, the end of the widened portion 33b of the TG1 line 32b is positioned.

The VR line 36j is formed over the gate electrode $24_{TG2}$ below the TG2 line 32d as viewed in the drawing. The pattern of the VR line 36j has a T-shape having a rectangular portion which is longer row-wise along the TG2 line 32d and the rectangular portion projected from the rectangular portion downward as viewed in the drawing. Below the end of the VR line 36j on the side of the TG2 line 32d, the end of the widened portion 33d of the TG2 line 32d is positioned.

As shown in FIG. 6, the third metal interconnection layer 76 forms a VR line electrically connected to the drain region of the reset transistor RST via a contact plug 74b and electrically connected to the VR lines 36i, 36j of the second metal interconnection layer 36 respectively via contact plugs 74c, 74d.

The VR line 76 is extended both row-wise and column-wise and function as a shield film. In the openings 80 where the VR lines 76 are not formed, the photodiodes PD1, PD2 are positioned. In the region where the VR line extended row-wise and column-wise intersects each other, a rectangular metal layer 86 is formed integral with the VR line 76. Thus, the openings 80, in which the photodiodes PD1, PD2 of the respective pixels are positioned, are defined in an octagon.

The VR line 76 are electrically connected to the drain region of the reset transistor RST via the contact plug 30i, the lead interconnection 32i of the first metal interconnection layer 32, the contact plug 34h, the lead interconnection 36h of the second metal interconnection layer 36 and the contact plug 74b.

The VR line 76 is electrically connected to the VR lines 36i of the second metal interconnection layer 36 formed over the gate electrode $24_{TG1}$ via the contact plug 74c and to the VR lines 36j of the second metal interconnection layer 36 formed over the gate electrode $24_{TG2}$ via the contact plug 74d. The VR lines 36i of the second metal interconnection layer 36 electrically connected to the VR line 76 are for covering the gap between the Select line 32a and the TG1 line 32b above the gate electrode $24_{TG1}$ to shield the gate electrode $24_{TG1}$ from light. The VR lines 36j of the second metal interconnection layer 36 electrically connected to the VR line 76 are for covering the gap between the RST line 32c and the TG2 line 32d above the gate electrode $24_{TG2}$ to shield the gate electrode $24_{TG2}$ from light.

The plane structure of the third metal interconnection layer shown in FIG. 6 is for the color pixel array unit 10a, and in the black array pixel unit 10b, the VR line 76, which function as the shield film, covered the entire surface of the array unit.

Next, the sectional structure of the pixel array unit 10 will be explained with reference to FIGS. 7A and 7B. FIG. 7A is a diagrammatic sectional view of the pixel array unit 10a, and FIG. 7B is a diagrammatic sectional view of the black pixel array unit 10b. In each sectional view, the sectional views along the line A–A', the line B–B' and the line C–C' in FIG. 3 are shown. In the following description, the PD2/TG2/FD2 region 22b will not be explained, but the PD2/TG2/FD2 region 22b is the same as the PD1/TG1/FD1 region 22a.

The device isolation film 20 for defining the device regions is formed on the silicon substrate 18. In FIGS. 7A and 7B, the respective device regions are, from the left side of the drawing, the PD1/TG1/FD1 region 22a, a read transistor region 22e and a well contact region 22w.

The color pixel array unit 10a shown in FIG. 7A is formed in a p-well formed in the p-type silicon substrate 18.

In the read transistor region 22e and the well contact region 22w, a p-well including a buried p-type layer 48 and a p-type layer 52 for the threshold voltage control is formed. In this p-well, the reset transistor RST, source follower transistor SF-Tr and the select transistor SELECT are formed.

The PD1/TG1/FD1 region 22a contains a region where a p-well including the buried p-type layer 48 and the p-type layer 50 is formed and a region where a p-well including the p-type layer 50 alone is formed. The region with the buried p-type layer 48 and the p-type layer 50 formed in is a part of the region for the floating diffusion FD formed in, which is in contact with the device isolation film. In the rest region, i.e., the region with the photodiode PD formed in, the region for the transfer transistor TG formed in and the region of the floating diffusion FD formed in, which is spaced from the device isolation film 20, the buried p-type layer 48 is not formed, but the p-type layer 50 alone is formed.

In the p-type layer 50, the photodiode PD and the transfer transistor TG are formed. In the region for the photodiode PD formed in, a buried n-type layer $26_{PD}$ for the photodiode PD is buried so as to compensate the p-well. A p+-type shield layer 58 is formed in the surface of the silicon substrate 18 above the buried n-type layer 26$_{PD}$.

On the other hand, the black pixel array unit 10b shown in FIG. 7B is formed in a p-well isolated from the p-type silicon substrate 18 by an n-well 44 and a buried n-type layer 46.

In the read transistor region 22e and the well contact region 22w, a p-well formed of a buried p-type layer 48 and the p-type layer 52 is formed. In the p-well, the reset transistor RST, the source follower transistor SF-Tr and the select transistor SELECT are formed.

In the PD1/TG1/FD1 region 22a, a p-well formed of the buried p-type layer 48 and the p-layer 50 is formed. In this p-well, the photodiode PD, the transfer transistor TG and the floating diffusion FD are formed. In the region for the photodiode PD formed in, a buried n-type layer 26$_{PD}$ for the photodiode PD is buried so as to compensate the p-well. A p+-type shield layer 58 is formed in the surface of the silicon substrate 10 above the n-type layer 26$_{PD}$.

As described above, in the solid-state image sensor according to the present embodiment, the color pixel array unit 10a is formed in the usual p-well, and the black pixel array unit 10b is formed in the p-well in the double well. The p-type layer 48 forming the p-wells is formed, in the color pixel array unit 10a, in the region other than the region for the photodiode PD formed in and the region for the transfer transistor TG formed in, but, in the black pixel array unit 10b, is formed in all the region including the region for the photodiode PD formed in and the region for the transfer transistor TG formed in.

In the color pixel array unit 10a, to make the width of the depletion layer to be formed between the buried n-type layer 26$_{PD}$ and the silicon substrate 10 large to increase the light absorption efficiency, it is preferable to make the impurity concentration of the silicon substrate 18 below the buried n-type layer 26$_{PD}$ low. To this end, the buried p-type layer 48 is not extended in the region for the photodiode PD formed in.

However, if the black pixel array unit 10b has the same constitution, the buried n-well 46 will be present immediately below the buried n-type layer 26$_{PD}$, with a result that the p-type impurity concentration between the buried n-type layer 26$_{PD}$ and the buried n-well 46 is lowered. Accordingly, the buried n-type layer 26$_{PD}$ and the buried n-well 46 are not sufficiently electrically isolated from each other, with a worst result that both may be electrically connected, causing defective operations. For the purpose of preventing such problem, in the solid-state image sensor according to the present embodiment, in the black pixel array unit 10b, the buried p-type layer 48 is formed on the entire surface including the region for the photodiode PD formed in and the region for the transfer transistor TG formed in.

In the color pixel array unit 10a, the buried p-type layer 48 is not formed either in the region for the transfer transistor TG formed in, because the end of the photoresist film used in forming the buried p-type layer 48 located near the transfer transistor TG may affect the impurity profile of the channel portion of the transfer transistor TG (see second embodiment).

FIG. 8 is a graph of depth-wise changes of the potential in the region for the photodiode PD formed in. In FIG. 8, the solid line indicates those of the color pixel, and the dotted line indicates those of the black pixel.

As shown, in the black pixel, because of the buried p-type layer 48 buried below the buried n-type layer 26$_{PD}$, the potential depth is smaller by about 0.3–0.4 V in comparison with that of the color pixel. Accordingly, the charge amount (saturated charge amount) stored in the photodiode PD corresponds to ~9000 in color pixels and ~5000 in black pixels under the well conditions of the present embodiment. Such the saturated charge amount difference between the color photodiode and the black photodiode is larger as the buried P-type layer 48 is more heavily doped.

However, the function of the black pixel is to form a reference signal of the pixel in a black state and may produce signal of a dark current of the photodiode PD. Accordingly, it is sufficient that the black pixel has a saturated charge amount which is about ⅔–½ of that of the color pixel.

The potential difference between the photodiode PD of the black pixel and the photodiode PD of the color pixel is large deep in the substrate, but nearer the surface of the substrate, substantially no potential difference is present. The leakage current of the photodiode PD is determined by defects near the surface and the electric field at the junction (potential profiles), and it can be said that the photodiode PD of the black pixel of the solid-state image sensor according to the present embodiment has substantially the same dark current as the photodiode PD of the color pixel.

Thus, no problem operationally takes place even when, as in the solid-state image sensor according to the present embodiment, the buried p-type layer 48 is formed in the region for the photodiode PD formed in of the black pixel array unit 10b and is not formed in the region for the photodiode PD of the color pixel array unit 10a.

FIGS. 9A and 9B are views of extensions of the depletion layer of the photodiode PD. FIG. 9A shows the extension of the case that the end of the buried p-type layer 48 is spaced from the end of the buried n-type layer 26$_{PD}$, and FIG. 9B shows the extension of the case that the end of the buried p-type layer 48 substantially agrees with the end of the buried n-type layer 26$_{PD}$. FIGS. 9A and 9B correspond to the sectional view along the line D–D' in FIG. 3.

Unless the buried p-type layer 48, which is a p-type layer formed in the deep region, is not sufficiently spaced from the buried n-type layer 26$_{PD}$ of the photodiode PD, the depletion layer of the photodiode PD cannot easily extend deeper (see FIG. 9B). On the other hand, when the a sufficient space is ensured between the buried p-type layer 48 and the buried n-type layer 26$_{PD}$ of the photodiode PD, the depletion layer of the photodiode PD is not hindered from extending by the buried p-type layer 48 and extends deep (see FIG. 9A). The extension increase of the depletion layer means improvement of the light absorption efficiency. Accordingly, in the color pixel array unit 10a, it is preferable that the end of the buried p-type layer 48 is spaced from the end of the buried n-type layer 26$_{PD}$. It is preferable that the gap between the buried p-type layer 48 and the end of the buried n-type layer 26$_{PD}$ is set to be about 0.2–0.5 μm on the mask size.

When the buried p-type layer is formed in the p-well in the region for the peripheral circuit transistors formed in, it is preferable that the buried p-type layer 48 of the pixel array unit and the buried p-type layer (buried p-type layer 40) in the region for the peripheral circuit transistors formed in are different in the concentration. Generally, the buried p-type layer in the region for the peripheral circuit transistors formed in is required to be higher than that of the buried p-type layer of the pixel array unit. When these buried p-type layers are formed (concurrently) in the same concentration, the extension of the depletion layer of the photodiode PD is restricted, and sufficient light absorption efficiency cannot be often obtained. Accordingly, it is preferable that the buried p-type layer of the pixel array unit and the buried p-type layer in the region for the peripheral transistors formed in are formed separately in accordance with the respective required concentrations.

The p-type buried layer 48 in the pixel array unit 10 is formed in a lower concentration than the buried p-type layer formed in the peripheral circuit region, whereby the extension of the depletion layer of the photodiode PD can be further increased. Because of the buried p-type layer 48 below the photodiode of the black pixel, the difference in the saturated charge amount between the photodiode of the color pixel and the photodiode of the black pixel can be made small.

On the other hand, the p-type layer 52 for the threshold voltage control layer for the read transistors is formed in the shallow region near the substrate surface and does not affect the extension of the depletion layer of the photodiode PD even when not spaced from the photodiode PD. To the contrary, the p-type layer 52 is formed in a higher concentration between the photodiode PD and the device isolation film 20, whereby the effect that the isolation between the photodiode PD and the device isolation film 20 can be reinforced can be obtained.

That is, the mask pattern for forming the buried p-type layer 48 and the mask pattern for forming the p-type layer 52 are made different, whereby the extension of the depletion layer of the photodiode PD is increased, and the isolation between the photodiode PD and the device isolation film 20 can be reinforced.

In the solid-state image sensor according to the present embodiment, the channel width of the read transistors (the reset transistor RST, the source follower transistor SF-TR, the select transistor SELECT) is made narrow so as to make the narrow channel effect conspicuous and is narrower than the gate width of the n-channel transistors for the peripheral circuit. Accordingly, when the p-type layer 46 for the threshold voltage control of the n-channel transistors for the peripheral circuit and the p-type layer 52 for the threshold voltage control of the pixel array unit are formed (concurrently) in the same concentration, this often makes the characteristics control of the read transistors difficult.

In view of this, it is preferable that the p-type layer 42 for the threshold voltage control of the n-channel transistors for the peripheral circuits and the p-type layer 52 for the threshold voltage control of the pixel array unit are formed separately in accordance with the respective required concentrations. For example, when the device isolation film 20 has the ST1 structure, it is considered to make the dose for forming the p-type layer 52 larger by about ~1×10$^{12}$ cm$^{-2}$ than the dose for forming the p-type layer 42, because the threshold voltage in the narrow channel tends to lower.

The p-type layer 52 is formed also between the buried n-type layer 26$_{PD}$ of the photodiode PD and the device isolation film 20 is formed, whereby the isolation between the photodiode PD and the device isolation film 20 can be reinforced.

It is preferable that the p-type layer 50 formed in the PD1/TG1/FD1 region 22a has a lower p-type impurity concentration than the p-wells of the peripheral circuit transistors, whereby the charge transfer efficiency of the transfer transistor TG can be increased.

Then, the method for fabricating the solid-state image sensor according to the present embodiment will be explained with reference to FIGS. 10A to 17D. The FIGS. 10A, 11A, 12A, 13A, 14A, 15A, 16A and 17A show the regions for the n-channel transistor of the peripheral circuit to be formed in. The FIGS. 10B, 11B, 12B, 13B, 14B, 15B, 16B and 17B show the regions for the n-channel transistor of the peripheral circuit to be formed in, which is formed in the double well. The FIGS. 10C, 11C, 12C, 13C, 14C, 15C, 16C and 17C show the color pixel array unit 10a. The FIGS. 10D, 11D, 12D, 13D, 14D, 15D, 16D and 17D show the black pixel array unit 10b. The FIGS. 10C–10D, 11C–11D, 12C–12D, 13C–13D, 14C–14D, 15C–15D, 16C–16D and 17C–17D show the sectional views along the line A–A', the line B–B' and the line C–C' in FIG. 3.

First, the device isolation film 20 is formed in the silicon substrate 18 by, e.g., ST1 method, to define on the silicon substrate 18 the region for the transistors of the peripheral circuit to be formed in, the PD1/TG1/FD1 region 22a, the read transistor region 22e, etc.

Then, the buried p-type layer 40 and the p-type layer 42 for the threshold voltage control are formed in the region for the n-channel transistors of the peripheral circuit to be formed in (FIGS. 10A to 10D). The buried p-type layer 40 is mainly for lowering the well resistance of the region for the n-channel transistor to be formed in.

The buried p-type layer 40 is formed by implanting, e.g., boron ions in the direction normal to the substrate at a 300 keV acceleration energy and a 3×10$^{13}$ cm$^{-2}$ dosage. The p-type layer 42 is formed by implanting, e.g., boron ions in a direction tilted by, e.g., 7° to the normal to the substrate at a 30 keV acceleration energy and ~5×10$^{12}$ cm$^{-2}$ dosage.

Then, the n-well 44 is formed in the region for the n-well to be formed in, and the buried n-well 46 is formed in the region for the double well to be formed in (the region where the peripheral n-channel transistor formed in the double well is to be formed and the black pixel array unit 10b). Thus, in the region where the peripheral n-channel transistor formed in the double well is to be formed and the black pixel array unit 10b, the p-type region surrounded by the n-well 44 and the buried n-well 46 is electrically isolated from the deep portion of the silicon substrate 18 (FIGS. 11A–11D). Although not shown, the n-well 44 is formed also in the region where the peripheral p-channel transistor is to be formed.

Then, the buried p-type layer 48 is formed in the color pixel array unit 10a and the black pixel array unit 10b. At this time, the buried p-type layer 48 is formed in all the black pixel array unit 10b but, in the color pixel array unit 10a, is formed in the region other than the regions for the photodiodes PD1, PD2 to be formed in and regions for the transfer transistors TG1, TG2 to be formed in.

The buried p-type layer 48 is formed by implanting, e.g., boron ions in the direction normal to the substrate at a 300 keV acceleration energy and a ~1×10$^{13}$ cm$^{-3}$ dosage by using as the mask a photoresist film 72 which, in the color pixel array unit 10a, covers the slanted portions as exemplified in FIG. 18 and exposes the entire surface in the black pixel array unit 10b.

The concentration of the buried p-type layer 48 to be formed in the pixel array unit 10 is usually lower than that of the p-type layer 40 to be formed in the region where the peripheral n-channel transistors formed in the double well is to be formed. Accordingly, when these buried p-type layers are formed (concurrently) in the same concentration, the extension of the depletion layer of the photodiode PD is restricted, and sufficient light absorption efficiency cannot be often obtained. Accordingly, it is preferable that the buried p-type layer 48 in the pixel array unit and the buried p-type layer in the region for the peripheral circuit transistors to be formed in are formed separately in accordance with the respective required concentrations.

However, when the concentration difference between the buried p-type layers 40, 48 is small, or their concentrations are the same, these wells may be formed concurrently. It is also possible that when the buried p-type layer of a lower concentration is formed, ion implantation is performed in the region for the buried p-type layer of higher concentration to be formed in, and the additional ion implantation is performed when the buried p-type layer of the higher concentration is formed, whereby the ion implantation amount as a whole is decreased to thereby rationalize the steps.

Then, the p-type layer 50 is formed in the PD1/TG1/FD1 region 22a of the color pixel array unit 10a and the black pixel array unit 10 (FIGS. 12A–12D).

The p-type layer 50 is formed by using a photoresist film 78 covering the slanted part as exemplified in FIG. 19 respectively by implanting, e.g., boron ions in a direction tilted by, 7° to the normal to the substrate at a 144 keV acceleration energy and a ~2×10$^{12}$ cm$^{-2}$ dosage and by implanting, e.g., boron ions in a direction tilted by, e.g., 7° to the normal to the substrate at a 30 keV acceleration energy and a 2×10$^{12}$ cm$^{-2}$ dosage.

At this time, the dose for forming the p-type layer 50 is set a half or less of the dose for forming the p-type layer 42, whereby the threshold voltage of the transfer transistor TG1 can be lowered. Thus, the threshold voltage of the transfer transistor TG1 is made low, whereby the charge transfer efficiency from the photodiode PD1 to the floating diffusion FD1 is increased, and the p-well has a higher concentration than the substrate concentration, whereby the potential of the channel portion of the transfer transistor TG1 can be increased to thereby increase the saturated charge amount of the photodiode PD1.

The p-type layer 52 for the threshold voltage control is formed in the read transistor region 22e, and between the region for the photodiode PD1 to be formed in and the device isolation film 20. The p-type layer 52 formed between the region for the photodiode PD1 to be formed in and the device isolation film 20 is for increasing the p-type impurity concentration between the region for the photodiode PD1 to be formed in and the device isolation film 20 to thereby reinforce the isolation between the photodiode PD1 and the device isolation film 20.

The p-layer 52 is formed by implanting, e.g., boron ions in a direction tilted by, e.g., 7' to the normal to the substrate at a 30 keV acceleration energy and ~5×10$^{12}$ cm$^{-2}$ dosage by using as the mask a photoresist film 82 covering the slanted portions as exemplified in FIG. 20.

The dose for forming the p-type layer 52 is substantially equal to the dose for forming the p-type layer 42. In the pixel array unit 10, where the read transistor has a narrower channel (of a size which makes the narrow channel effect conspicuous) than the peripheral circuit transistors, the dose for forming the p-type layer 52 and the dose for forming the p-type layer 42 are made different from each other, whereby the threshold voltage can be controlled independently of the peripheral circuit transistors. In the ST1 structure, for example, the narrow channel effect tends to lower the threshold voltage. The dose for forming the p-type layer 52 is often made larger by about ~1×10$^{12}$ cm$^{-2}$ than the dose for forming the p-type layer 42. In such case, it is preferable to form the p-type layer 42 and the p-type layer 52 separately, as in the method for fabricating the solid-state image sensor according to the present embodiment.

However, when the concentrations of the p-type layers 42 and 52 has a small difference therebetween or are equal to each other, these layers may be formed concurrently. It is possible that when the threshold voltage control layer of a lower concentration is formed, ion implantation is performed in the region for the threshold voltage control layer of a higher concentration, and when the threshold voltage control layer of the higher concentration is formed, additional ion implantation is performed. The ion implantation amount as a whole may be thus decreased to rationalize the steps. Such ion implantation may be rationalized by the ion implantation of lower energy for forming the p-type layer 50.

Then, the buried n-type layer 26$_{PD}$ for the photodiode PD1 is formed in the region for the photodiode PD1 to be formed in (FIGS. 13A–13D).

The buried n-type layer 26$_{PD}$ is formed respectively by implanting, phosphorus ions in a direction tilted by 7° to the normal to the substrate at a 325 keV acceleration energy and a 1~2×10$^{12}$ cm$^{-2}$ dosage, by implanting, e.g., phosphorus ions in a direction tilted by 7° to the normal to the substrate at a 207 keV acceleration energy and a 1~2×10$^{12}$ cm$^{-2}$ dosage and by implanting, e.g., phosphorus ions in a direction tilted by 7° to the normal to the substrate at a 135 keV acceleration energy and a 1~2×10$^{12}$ cm$^{-2}$ dosage.

Then, the gate insulating film 54 of a silicon oxide film of, e.g., an about 8 nm-thick is formed on the surface of the silicon substrate 10 by, e.g., thermal oxidation.

Next, a polycrystalline silicon film of, e.g., a ~180 nm-thick is deposited by, e.g., CVD method.

Then, phosphorus ions, for example, are implanted into the polycrystalline silicon film in the region for the n-channel transistor of the peripheral circuit to be formed in and the pixel array unit 10 in a direction tilted by, e.g., 7° to the normal to the substrate at a 20 keV acceleration energy and a 4×10$^{15}$ cm$^{-2}$ dosage.

Then, thermal processing is performed at 800° C. for 60 minutes to activate the implanted impurities. Thus, the polycrystalline silicon film of the region for the n-channel transistors of the peripheral circuit to be formed in and the pixel array unit 10 is made n$^+$-type.

Then, the polycrystalline silicon film is patterned by photolithography and dry etching to form the gate electrode 24 of the n-channel transistor of the peripheral circuit, the gate electrode 24$_{TG}$ of the transfer transistor TG, the gate electrode 24$_{RST}$ of the reset transistor RST, the gate electrode 24$_{SF-Tr}$ of the source follower transistors SF-Tr, and the gate electrode 24$_{Select}$ of the select transistor SELECT.

Next, impurity diffused regions 56 which are to be the LDD regions of the respective transistors are formed. The impurity diffused regions 56 are formed by implanting, e.g., phosphorus ions into the normal to the substrate at a 20 keV acceleration energy and a 4×10$^{13}$ dosage.

Then, the p$^+$-type shield layer 58 is formed on the side of the surface of the silicon substrate 18 in the region for the photodiode PD1 to be formed in to thereby make the photodiode PD1 buried type (FIGS. 14A–14D). The p$^+$-type shield layer 58 is formed by implanting, e.g., boron ions in a direction tilted by 7° to the normal to the substrate at a 10 keV acceleration energy and ~1×10$^{13}$ dosage.

Then, contact layers 60 are formed in the region where the contact to the floating diffusion FD1 is to be formed and in the source region of the reset transistor RST. The contact layers 60 are formed by implanting, e.g., phosphorus ions at a 15 keV acceleration energy and a ~2×10$^{15}$ dosage.

Then, a silicon oxide film 62 of, e.g., a 100 nm-thick is formed by, e.g., CVD method.

Next, the silicon oxide film 62 etched back by using as the mask a photoresist film (not shown) covering the region for the photodiode PD1 to be formed in, the region for the transfer transistor TG1 to be formed in and the region for the reset transistor RST to be formed in is formed to form sidewall insulating films 64 on the side walls of the gate electrodes 24, 24$_{SF-Tr}$, 24$_{Select}$.

Then, ion implantation is performed by using as the mask the gate electrodes 24, 24$_{SF-Tr}$, 24$_{Select}$, the silicon oxide film 62 and the sidewall insulating films 64 to form heavily doped impurity diffused regions 66. The impurity diffused regions 66 are formed by implanting, e.g., phosphorus ions in a direction tilted by 7° to the normal to the substrate at a 13 keV acceleration energy and a $2 \times 10^{15}$ dosage.

Then, by salicide process, a cobalt silicide film 68 is formed selectively on the gate electrodes 24, 24$_{SF-Tr}$, 24$_{Select}$ and the impurity diffused regions 66 (FIGS. 16A–16D). In this step, the silicon oxide film 62 functions to prevent the region for the photodiode PD1 to be formed in, the region for the transfer transistor TG1 to be formed in and the region for the reset transistor RST to be formed in being silicided.

Then, by, e.g., plasma CVD method, a silicon oxide film of, e.g., ~20 nm-thick, a silicon nitride film of, e.g., ~70 nm-thick and a TEOS oxide film of, e.g., ~1000 nm-thick are deposited, and then the surface is planarized by, e.g., CMP method to form an inter-layer insulating film 70 of the stacked structure of these insulating films.

Then, a contact plug 30 connected to the n-channel transistors of the peripheral circuit, a contact plug 30$p$ connected to the p-well contact region, a contact plug 30$n$ connected to the n-well contact region, a contact plug 30$h$ connected to the contact layer 60 of the floating diffusion FD1, the contact plugs 30$i$, 30$k$ connected to the source/drain regions of the reset transistor RST, a contact plug 30$e$ connected to the source region of the select transistor SELECT, etc. are formed in the inter-layer insulating film 70.

Then, the first to the third metal interconnection layers, etc. are formed in the patterns shown in FIGS. 4 to 6, and the solid-state image sensor according to the present embodiment is completed.

As described above, in the solid-state image sensor according to the present embodiment, the color pixel array unit is formed in the usual p-well, and the black pixel array unit is formed in the p-well in the double well. The buried p-type layer is formed between the photodiode of the black pixel cell and the n-well outside the double well, whereby the photodiode and the well outside the double well can be isolated from each other without failure. The buried p-type layer is not formed below the photodiode of the color pixel cell, whereby the depletion layer of the photodiode of the color pixel cell can extend deep in the substrate, and the photodiode and the well outside the double well can be isolated from each other without sacrificing the sensitivity of the photodiode of the color pixel cell.

In the color pixel cell, the end of the buried n-type layer of the photodiode and the end of the buried p-type layer formed in the color pixel cell are sufficiently isolated from each other, whereby the depletion layer of the photodiode can extend sufficiently deep in the substrate. Thus, the sensitivity of the photodiode can be increased.

The buried p-type layer formed in the pixel array unit and buried p-type layer formed in the peripheral circuit unit are separately formed, whereby the characteristics of the pixel array and the characteristics of the peripheral circuit transistors can be separately optimized.

The buried p-type layer has a lower concentration in the pixel array unit than in the peripheral circuit unit, whereby the difference in the saturated charge amount between the photodiode of the color pixel cell and the photodiode of the black pixel cell can be made small.

[A Second Embodiment]

The solid-state image sensor and the method for fabricating the same according to a second embodiment of the present invention will be explained with reference to FIGS. 21A to 23B. The same members of the present embodiment as those of the solid-state image sensor and the method for fabricating the same according to the first embodiment shown in FIGS. 1 to 20 are represented by the same reference numbers not to repeat or to simplify their explanation.

Figure 21A:
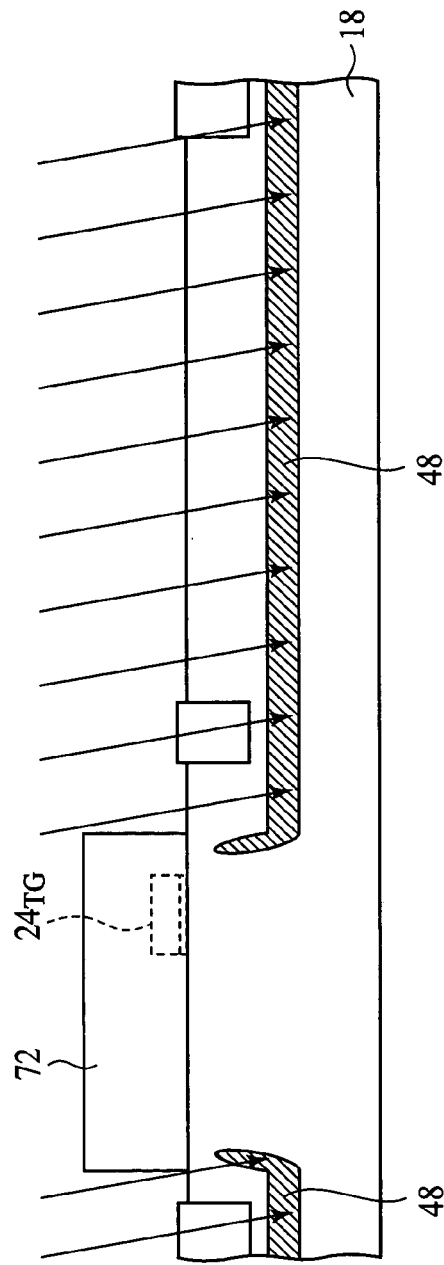
FIGS. 21A and 21B are diagrammatic sectional views of the solid-state image sensor according to a second embodiment of the present invention, which show a structure thereof and the method for fabricating the same.
Figure 21B:
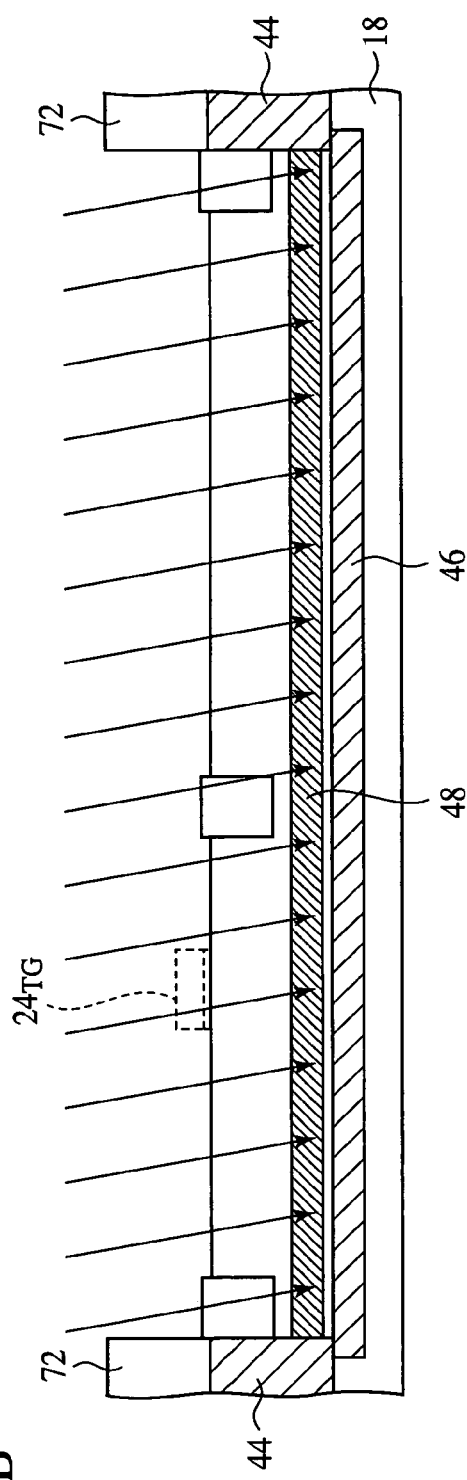
Figure 22:
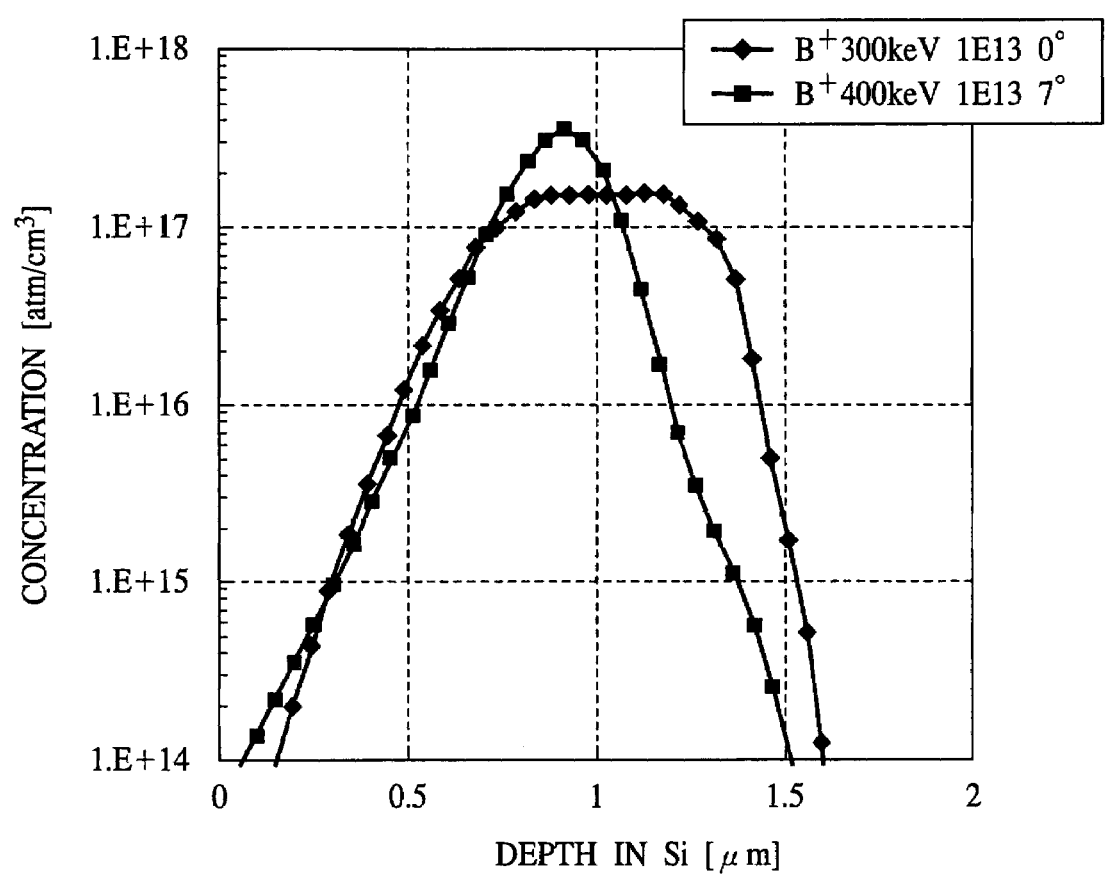
FIG. 22 is a graph of the depth-wise distribution of boron forming the buried p-type diffused layer.
Figure 23A:
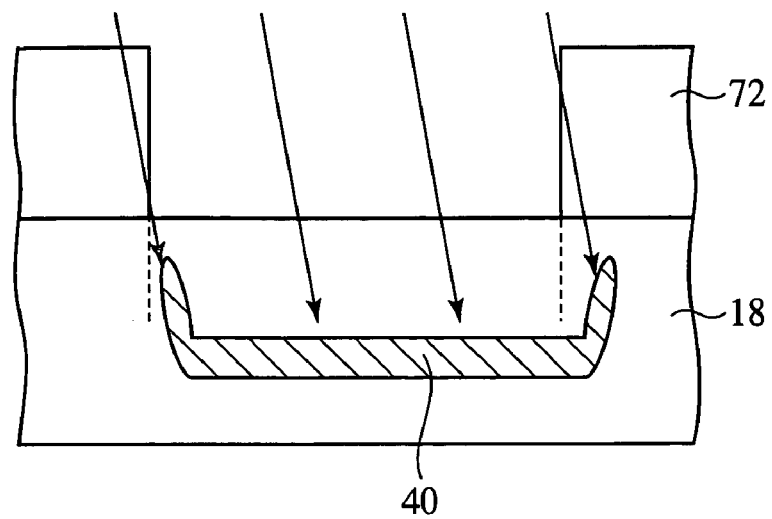
FIGS. 23A and 23B are views showing the difference in the buried p-type layer distribution between the tilted ion implantation and the ion implantation normal to the substrate.
Figure 23B:
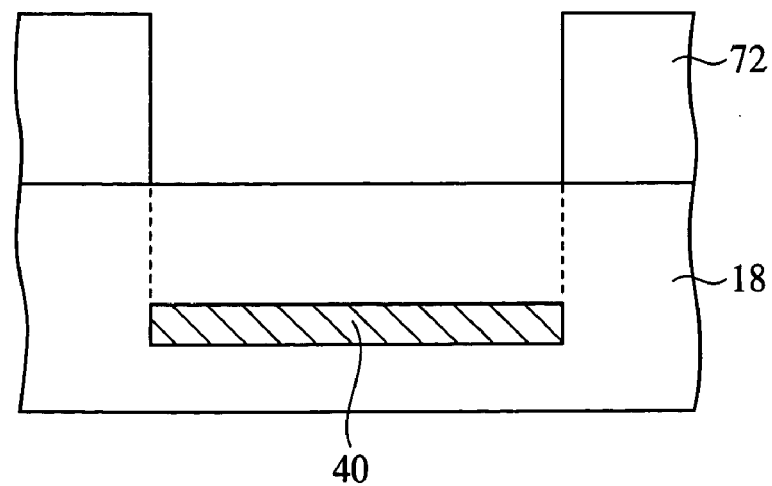

FIGS. 21A and 21B are diagrammatic sectional views showing a structure and the method for fabricating the same of the solid-state image sensor according to the present embodiment. FIG. 22 is a graph of a depth-wise distribution of boron forming a buried p-type layer. FIGS. 23A and 23B are views explaining distribution differences of the buried p-type layer made by slant ion implantation and by ion implantation normal to the substrate.

The solid-state image sensor and the method for fabricating the same according to the present embodiment will be explained with reference to FIGS. 21A and 21B.

In the method for fabricating the solid-state image sensor according to the present embodiment, in the step of the method for fabricating the solid-state image sensor according to the first embodiment shown in FIG. 12, the buried p-type layer 48 is formed by ion implantation in a random direction (direction tilted from the normal to the substrate).

In the method for fabricating the solid-state image sensor according to the first embodiment, the buried p-type layer 48 is formed by implanting boron ions normally to the substrate at a 300 keV acceleration energy and $1 \times 10^{13}$ cm$^{-2}$ dosage.

In the method for fabricating the solid-state image sensor according to the present embodiment, however, the buried p-type layer 48 is formed by implanting boron in a direction tilted by 7° to the normal to the substrate at ~400 keV acceleration energy and $\sim 1 \times 10^{13}$ cm$^{-2}$ dosage.

In the ion implantation normal to the substrate, the peak position (projected range: Rp) of the impurity distribution tends to be shallower at the peripheral part of the wafer than at the center of the wafer. This is because ions tend to enter the substrate deeply near the center of the wafer due to channeling of the ions, but at the peripheral part of the wafer, the ions are a little tilted from the normal to the substrate to decrease the channeling component.

When the buried p-type layer 48 is shallow, especially in the black pixel array unit 10$b$, where the buried n-type layer 26$_{PD}$ and the buried p-type layer 48 are in contact with each other, the n-type impurity forming the buried n-type layer 26$_{PD}$ is compensated by the p-type impurity forming the buried p-type layer 48, and the potential becomes shallow.

The ion implantation for forming the buried p-type layer 48 is performed in a random direction, i.e., a direction in which channeling of the ions does not take place, whereby fluctuations of the impurity profile of the formed buried p-type layer 48 can be made smaller in comparison with that given by the ion implantation in the normal to the substrate. Generally, implanting direction is tilted by about 5–9° to the direction of channeling axis (for a non-off-cut substrate, the normal to the substrate) to be a random direction. By the ion implantation performed at a tilt angle of about 5–9°, even when the incidence angle of the ions is fluctuated between the central part of the wafer and the peripheral part thereof, no channeling due to this fluctuation takes place. The tilt angle is not limited to about 5–9° and may be a tilt angle which causes the ion implantation in a random direction.

Thus, the buried p-type layer 48 is formed by ion implantation in a random direction, whereby the depth-wise distribution of the impurity has the intra-wafer plane uniformity improved, and the pixels can have little fabrication fluctuations.

As shown in FIGS. 21A and 21B, the ion implantation is performed by using as the mask a photoresist film 72 which, in the color pixel array unit 10a, covers the region for the photodiode PD to be formed in and the region for the transfer transistor TG to be formed in and, in the black pixel array unit 10b, exposes the entire region.

When the ion implantation is performed obliquely, at the end of the photoresist film 72, ions are deprived of part of the energy by the photoresist film 72 and enter the silicon substrate 18. Resultantly, near the end of the photoresist film 72, the buried p-type layer 48 is formed, extended in the shallow region of the silicon substrate 18. With the shallow region of the buried p-type layer 48 overlapping the channel portion of the transfer transistor TG, the threshold voltage of the transfer transistor TG is high, and the charge transfer efficiency is lowered.

In the method for fabricating the solid-state image sensor according to the present embodiment, the pattern in which the end of the photoresist film 72 is spaced from the channel portion of the transfer transistor TG sufficiently (by 0.15 µm or more, preferably about 0.2–0.3 µm) is used so that the part where the buried p-type layer 48 is shallower does not overlap the channel portion of the transfer transistor TG.

As shown in FIG. 21A, the direction of the ion implantation is slanted from the photodiode PD toward the transfer transistor TG, whereby the portion where the buried p-type layer 48 is shallower can be remote from the channel portion of the transfer transistor TG.

FIG. 22 is a graph of the depth-wise distribution of boron forming the buried p-type layer 48. In the graph, the ■ marks indicate the forming conditions of the present embodiment ($B^+$, 400 keV, $1\times10^{13}$ cm$^{-2}$, 7°), and the ♦ marks indicate the forming conditions of the first embodiment ($B^+$, 300 keV, $1\times10^{13}$ cm$^{-2}$, 0°).

As shown, it is seen that under the conditions of the first embodiment, the channeling component is large, and the profile of the boron is expanded depth-wise of the substrate, but under the conditions of the present embodiment, the profile is acute.

In the ion implantation in the direction normal to the substrate, the expansion of the profile changes with levels of the channeling. Accordingly, when the angle (tilt angle) of the ion implantation changes, e.g., by ~1° between the center of the wafer and the peripheral part of the wafer, the channeling component is accordingly decreases, and the profile of the buried p-type layer 48 varies between the center of the wafer and the peripheral part of the wafer.

As in the present embodiment, the ion implantation direction is, in advance, decided, e.g., tilted by about 7°, whereby even when the incidence angle a little varies in wafer plane, the influence of the channeling is prevented, and the profile of the buried p-type layer 48 is prevented from varying.

As described above, when the ion implantation is performed obliquely, at the end of the photoresist film 72, the pattern of the photoresist film 72 and the region for the impurity to be implanted into are offset from each other, or the impurity is implanted shallower than intended (see FIG. 23A). Such variations of the impurity profile are influential also in the peripheral circuit and vary the characteristics of transistors formed near the end of the photoresist film 72. Especially in the peripheral circuit, where n-channel transistors and p-channel transistors are mixed, the end of the photoresist film is very influential. On the other hand, in the peripheral logic circuit, a little variation of the depth of the buried p-type layer 44 is not so influential as in the black pixel cell. Accordingly, it is preferable that the buried p-type layer 40 to be formed in the region for the n-channel transistor of the peripheral circuit to be formed in is formed by the ion implantation in the direction normal to the substrate (see FIG. 23B).

As described above, according to the present embodiment, the buried p-type layer to be formed in the pixel array unit is formed by the ion implantation in a random direction, whereby the depth-wise distribution of the impurity has improved intra-wafer plane uniformity, and the pixels have few fabrication fluctuations.

The buried p-type layer to be formed in the peripheral circuit unit is formed by the ion implantation in the direction normal to the substrate, whereby variations of the device characteristics due to the offset of the part for the impurity to be implanted into and variations of the implantation depth can be prevented.

[A Third Embodiment]

The solid-state image sensor and the method for fabricating the same according to a third embodiment of the present invention will be explained with reference to FIGS. 24A to 25. The same members of the present embodiment as those of the solid-state image sensor and the method for fabricating the same according to the first and the second embodiments shown in FIGS. 1 to 23B are represented by the same reference numbers not to repeat or to simplify their explanation.

Figure 24A:
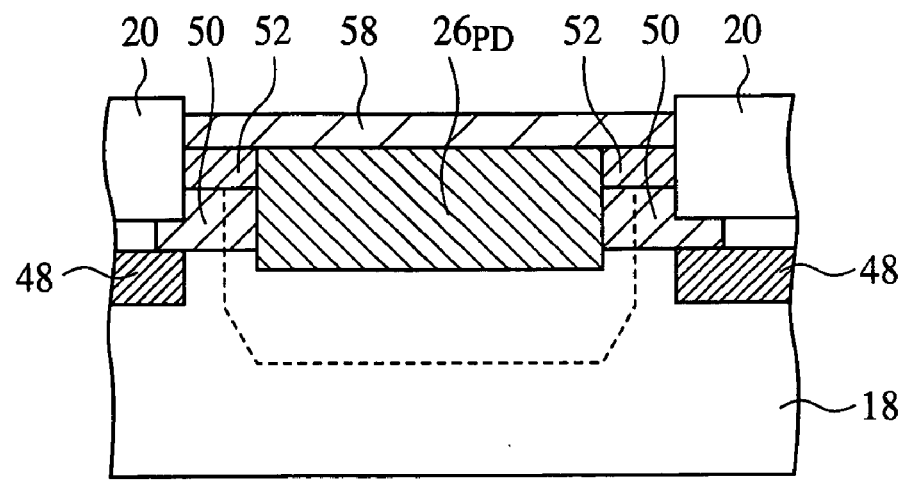
FIGS. 24A and 24B are diagrammatic sectional views of the solid-state image sensor according to a third embodiment of the present invention, which show a structure thereof.
Figure 24B:
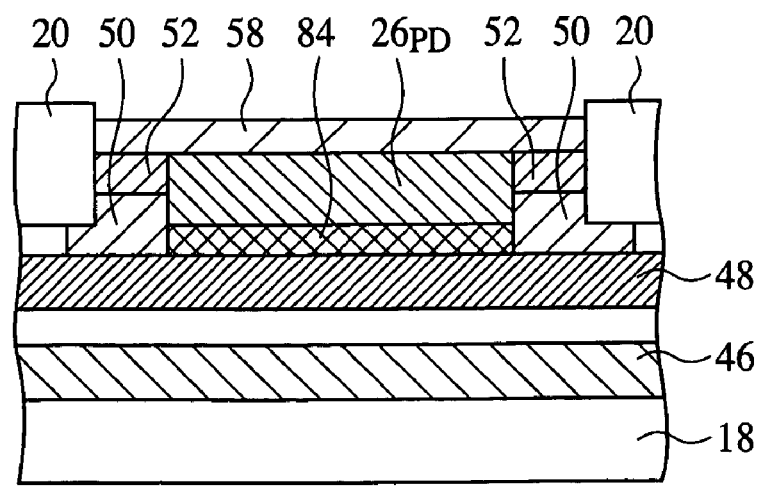

FIGS. 24A and 24B are diagrammatic sectional views of the solid-state image sensor according to the present embodiment, which show a structure thereof. FIG. 25 is a graph of depth-wise changes of the potential in the region for a photodiode to be formed in of the solid-state image sensor according to the present embodiment.

In the solid-state image sensor according to the first and the second embodiments, the buried n-type layer $26_{PD}$ is formed under the same conditions for the photodiode PD of the color pixel array unit 10a and for the photodiode PD of the black pixel array unit 10b. In the solid-state image sensor according to the present embodiment, the buried n-type layer $26_{PD}$ is formed in a higher concentration for the photodiode PD of the black pixel array unit 10b than for the photodiode PD of the color pixel array unit 10a.

That is, in the solid-state image sensor according to the present embodiment, the buried p-type layer $26_{PD}$ for the photodiode PD of the black pixel array unit 10b has a heavily doped region 84 at a deep part which is in contact with the buried p-type layer 48 (FIG. 24B), but the buried n-type layer $26_{PD}$ for the photodiode PD of the color pixel array unit 10a has no heavily doped region.

Thus, the n-type impurity concentration of the deep region of the buried n-type layer $26_{PD}$ for the photodiode of the black pixel array unit 10b is selectively made higher, whereby the potential of the photodiode PD of the black pixel array unit 10b can be made deep without changing the characteristics of the photodiode PD of the color pixel array unit 10a.

Figure 25:
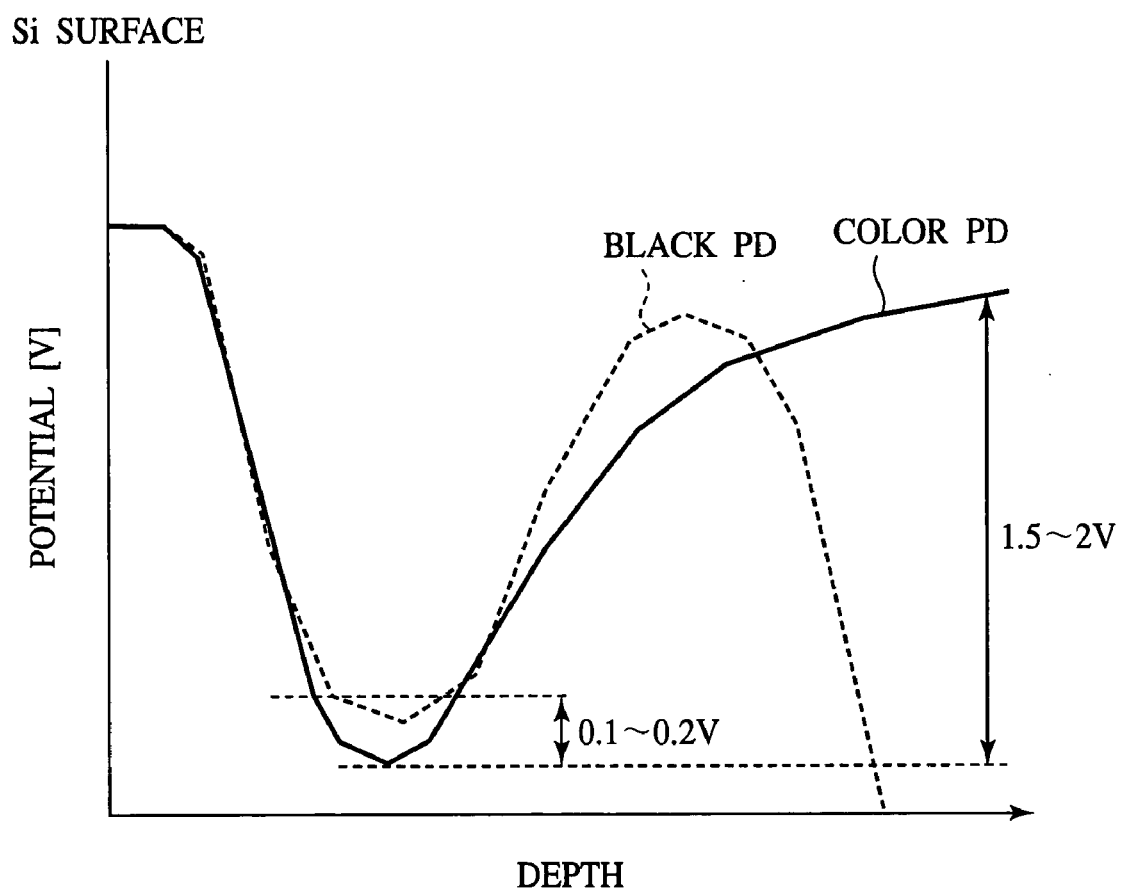
FIG. 25 is a graph of depth-wise changes of the potential of the photodiode formed region of the solid-state image sensor according to the third embodiment of the present invention.

FIG. 25 is a graph of depth-wise changes of the potential in the photodiode PD formed region. As shown in the graph, the n-type impurity concentration of the deep region of the buried n-type layer $26_{PD}$ for the photodiode PD of the black pixel array unit 10b is selectively made higher, whereby the potential depth of the black pixel can be made deeper by about 0.1–0.2 V shallower than that of the color pixel. This enables substantially the same saturated charge amount as that of the color pixel to be realized in the black pixel.

To fabricate the solid-state image sensor according to the present embodiment, an ion implantation step for forming a heavily doped region 84 in the black pixel array unit 10b may be simply added. Specifically, following the method for fabricating the solid-state image sensor according to the first embodiment, the buried n-type layer $26_{PD}$ is formed in the color pixel array unit 10a and the black pixel array unit 10b, and then the ion implantation is performed selectively in the region for the photodiode PD of the black pixel array unit 10b to be formed in to form the heavily doped region 84 in the buried n-type layer $26_{PD}$ of the black pixel array unit 10b. The additional ion implantation is performed by implanting, e.g., phosphorus ions in the direction tilted by 7° to the normal to the substrate at a 325 keV acceleration energy and a $0.4 \times 10^{12}$ cm$^{-2}$ dosage.

With the heavily doped region 84 formed deep in the buried n-type layer $26_{PD}$, the shallow part of the black pixel is not largely changed. Especially, the shallow region of the buried n-type layer $26_{PD}$ is formed by using the same mask in the color pixel and the black pixel, whereby the charge transfer is kept from being influenced by the disalignment between the buried n-type layer $26_{PD}$ and the gate electrodes.

As described above, according to the present embodiment, the heavily doped region is formed at the bottom of the buried n-type layer of the photodiode of the black pixel, whereby the potential of the photodiode of the black pixel can be made deep. Thus, the potential depth of the photodiode of the black pixel can be approximated to the potential depth of the photodiode of the color pixel, and substantially the same saturated charge amount as that of the color pixel can be realized.

[A Fourth Embodiment]

The solid-state image sensor and the method for fabricating the same according to a fourth embodiment of the present invention will be explained with reference to FIGS. 26A to 27. The same members of the present embodiments as those of the solid-state image sensor and the method for fabricating the same according to the first to the third embodiments shown in FIGS. 1 to 25 are represented by the same reference numbers not to repeat or to simplify their explanation.

Figure 26A:
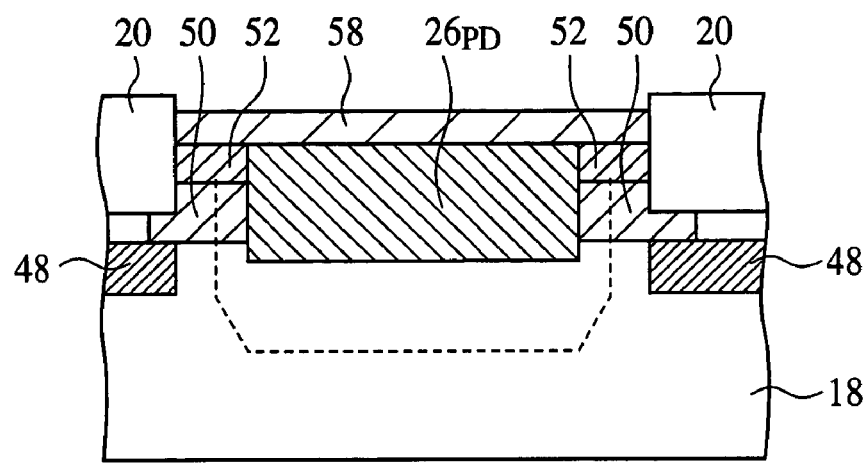
FIGS. 26A and 26B are diagrammatic sectional views of the solid-state image sensor according to a fourth embodiment of the present invention, which show a structure thereof.
Figure 26B:
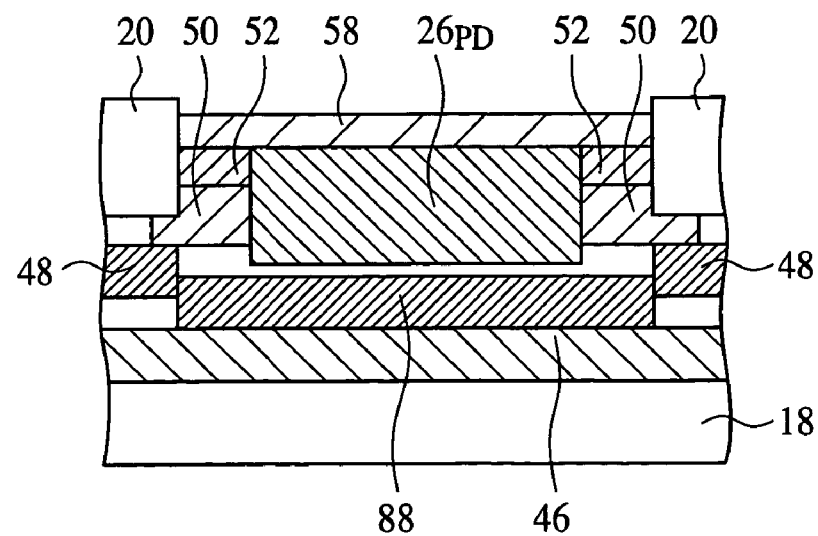

FIGS. 26A and 26B are diagrammatic sectional views of the solid-state image sensor according to the present embodiment, which show a structure thereof. FIG. 27 is a graph of depth-wise changes of the potential in the photodiode formed region of the solid-state image sensor according to the present embodiment.

In the solid-state image sensor according to the first to the third embodiments, in the black pixel array unit 10b, the buried p-type layer 48 is formed on the entire surface and, in the color pixel array unit 10a, formed in the region other than the photodiode PD formed region and the transfer transistor TG formed region. In the solid-state image sensor according to the present embodiment, in the color pixel array unit 10a and the black pixel array unit 10b, the buried p-type layer 48 is formed in the region other than the region for the photodiode PD to be formed in and the region for the transfer transistor TG to be formed in, and then a buried p-type layer 88 is formed in the region for the photodiode PD to be formed in and the region for the transfer transistor TG to be formed in of the black pixel array unit 10b.

This permits the concentration of the buried p-type layer 88 formed in the region for the photodiode PD to be formed in and the region for the transfer transistor TG to be formed in of the black pixel array unit 10b to be set different from the concentration of the buried p-type layer 48 of the color pixel array unit 10a. The depth of the buried p-type layer 88 can be also set different from the depth of the buried p-type layer 48.

Accordingly, the buried p-type layer 88 can be formed under minimal conditions required to isolate the buried n-type layer $26_{PD}$ from the buried n-well 46. This permits the p-type impurity concentration beneath the buried n-type layer $26_{PD}$ to be decreased, and the potential of the photodiode PD of the black pixel array unit 10b can be made deep.

Figure 27:
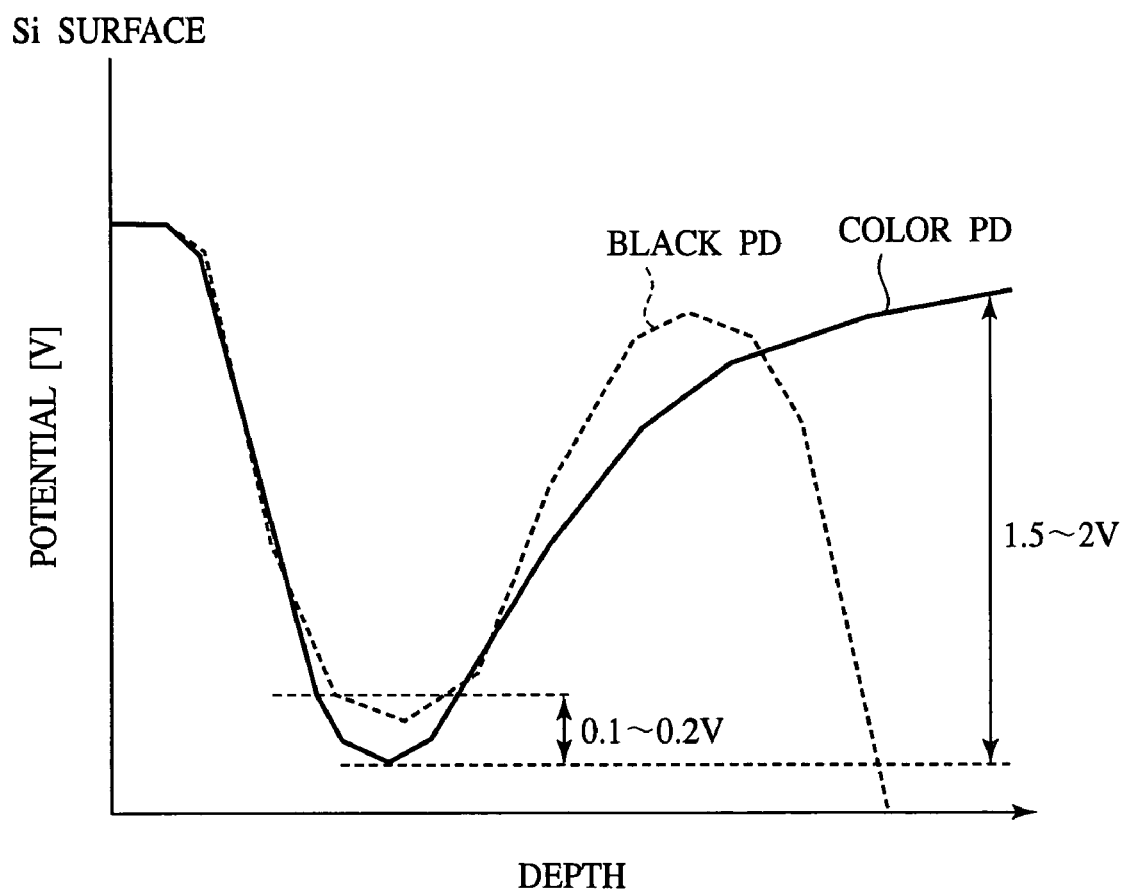
FIG. 27 is a graph of depth-wise changes of the potential of the photodiode formed region of the solid-state image sensor according to the fourth embodiment of the present invention.

FIG. 27 is a graph of depth-wise changes of the potential in the photodiode PD formed region. As shown, the buried p-type layer 88 is lightly doped, whereby the potential depth of the black pixel can be made deeper by about 0.1–0.2 V shallower than that of the color pixel. This enables substantially the same saturated charge amount as that of the color pixel to be realized in the black pixel.

The buried p-type layer 88 can be formed by implanting, e.g., boron ions in the direction tilted 7° to the normal to the substrate at a 500 keV acceleration energy and a $5 \times 10^{12}$ cm$^{-2}$ dosage. The concentration at this time is about a half of that of the buried p-type layer 48.

As described above, according to the present embodiment, the concentration of the buried p-type layer formed beneath the photodiode of the black pixel is lower than that of the rest region, whereby the potential of the photodiode of the black pixel can be made deep. Thus, the potential depth of the photodiode of the black pixel can be made approximate to the potential depth of the photodiode of the color pixel, whereby substantially the same saturated charge amount as that of the color pixel can be realized.

[A Fifth Embodiment]

The solid-state image sensor and the method for fabricating the same according to a fifth embodiment of the present invention will be explained with reference to FIGS. 28A and 28B. The same members of the present embodiments as those of the solid-state image sensor and the method for fabricating the same according to the first to the fourth embodiments shown in FIGS. 1 to 27 are represented by the same reference numbers not to repeat or to simplify their explanation.

Figure 28A:
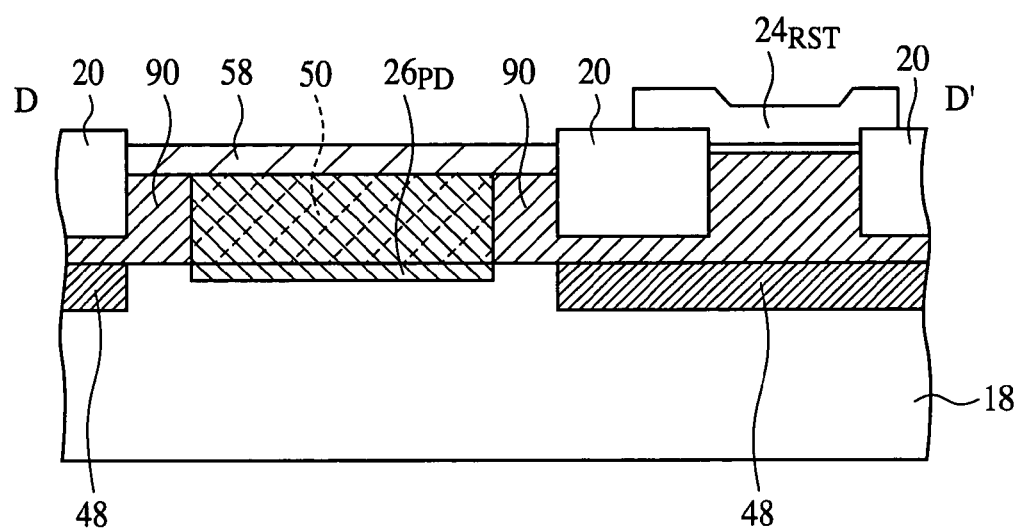
FIGS. 28A and 28B are diagrammatic sectional views of the solid-state image sensor according to a fifth embodiment of the present invention, which show a structure thereof.
Figure 28B:
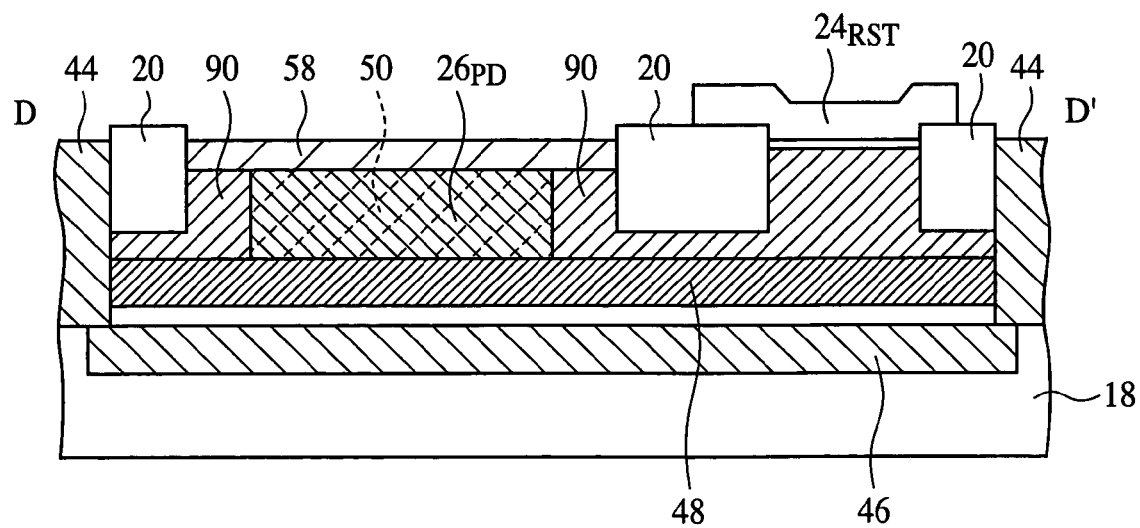
Figure 29A:
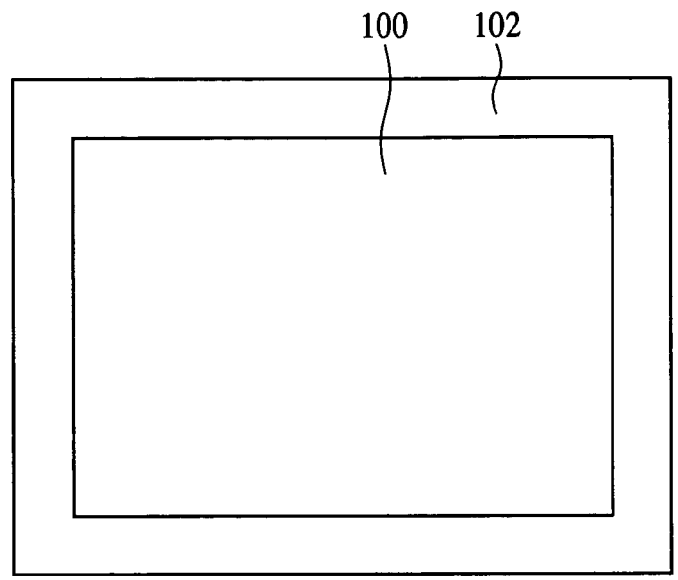
FIG. 29A is a plan view of the conventional solid-state image sensor, which shows the structure thereof.
Figure 29B:
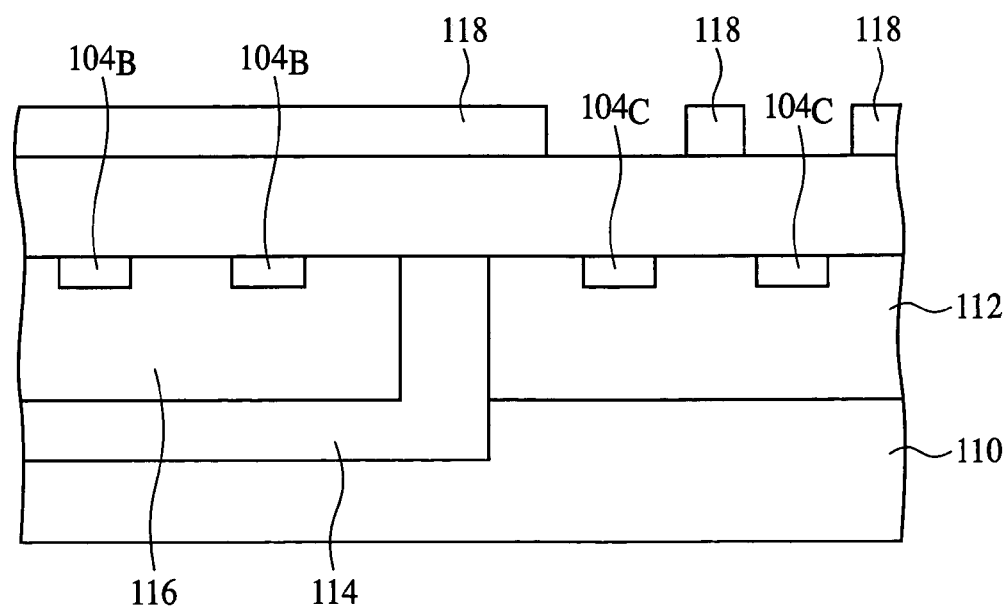
FIG. 29B is a diagrammatic sectional view of the conventional solid-state image sensor, which shows the structure thereof.

FIGS. 28A and 28B are diagrammatic sectional views of the solid-state image sensor according to the present embodiment, which show a structure thereof.

In the solid-state image sensor according to the first to the fourth embodiments, the p-type layers formed in the read transistor formed region 22e and the region between the photodiode PD and the device isolation film 20 are the p-type layer 52 for the threshold voltage control formed at an about ~0.1 µm-depth and the buried p-type layer 48 formed at an about ~0.8 µm-depth, and no specific implanted layer is formed at an about ~0.30 µm-depth.

In the solid-state image sensor according to the present embodiment, however, a p-type layer 90 is formed from the surface down to the vicinity of the bottom of the device isolation film 20 in the read transistor formed region 22e and the region between the photodiode PD and the device isolation film 20.

The p-type layer 90 is formed, whereby the p-type impurity concentration in a region between the photodiode PD and the device isolation film 20 can be high down to the deep region. Thus, the effect that the isolation between the photodiode PD and the device isolation film 20 can be further improved.

Forming the p-type layer 90 deep in the read transistor formed region 22e means that the source/drain junction capacitance of the read transistor is larger than that of the peripheral transistor. However, the operation speed of the pixel array unit is lower than that of the peripheral circuit unit, and this does not influence the operation speed of the device.

The p-layer 90 is formed by implanting, e.g., boron ions in the direction tilted by, e.g., 7° to the normal to the substrate at a 30 keV acceleration energy and a ~5×10$^{12}$ cm$^{-2}$ dosage, e.g., boron ions in the direction tilted by, e.g., 7° to the normal to the substrate at a 80 keV acceleration energy and a ~5×10$^{12}$ cm$^{-2}$ dosage and, e.g., boron ions in the direction tilted by, e.g., 7° to the normal to the substrate at a 144 keV acceleration energy and a ~5×10$^{12}$ cm$^{-2}$ dosage, respectively. The p-type layer 90 may be considered to have 80 keV ion implantation and 144 keV ion implantation in addition to the ion implantation of the p-type layer 52.

As described above, according to the present embodiment, the p-type layer is formed from the surface down to the vicinity of the bottom of the device isolation film in the read transistor formed region and the region between the photodiode and the device isolation film, whereby the ability of the isolation between the photodiode and the device isolation film can be further increased.

[Modified Embodiments]

The present invention is not limited to the above-described embodiments and can cover other various modifications.

For example, in the above-described embodiments, the present invention is applied to the 4-transistor solid-state image sensor including the read transistors co-used between 2 adjacent rows. The pixel structure the present invention is applicable to is not limited to that of the above-described embodiments. For example, the pixel structure may include a read transistor provided for each pixel or may be the 3-transistor pixel structure. The present invention is applicable widely to the solid-state image sensor including a color pixel array unit, and a black pixel array unit which is formed in double well.

The sequence of the ion implanting steps for forming the wells and the photodiodes is not limited to that of the above-described embodiments.

Furthermore, in the above-described embodiments, the photodiodes are buried-type, but the present invention is applicable to photodiodes other than the buried-type.

Even in the case the photodiode formed in the double well of the black pixel is not buried-type, a third well for isolating the photodiode from the rest region of the semiconductor substrate is formed, whereby the same noise preventing effect can be provided.

For the photodiode which is not the buried-type, a 3-Tr pixel or its modification is applied. In the structure for this, an n$^+$-diffused layer is formed in the surface of a (p-type) Si substrate, a contact for connecting to the photodiode is directly formed thereon, and the photodiode is connected directly to the gate of the source follower transistor via the contact. In the 4-Tr pixel, the charge-voltage conversion is performed by floating diffusion FD, but in the 3-Tr pixel, in which the photodiode is connected directly to the source follower transistor, a signal charge is converted to a voltage signal directly by the capacitance of the photodiode itself, based on charge-voltage conversion (V=Q/C) (V is a voltage change by a signal charge; Q is a signal charge; and C is a capacitance of a node connected to the source follower transistor and is to be mainly a junction capacitance of the photodiode). A photodiode which is not the buried-type is formed in a third well of the black pixel, which is a structure different from that of the color pixel, and then the capacitance of the photodiode is changed. That is, because of the second buried impurity doped layer formed immediately below the photodiode, the capacitance of the photodiode of the black pixel is larger than that of the photodiode of the color pixel, and the charge-voltage conversion is degraded in place of the noise preventing effect. Then, the impurity concentration of the second impurity doped layer of the black pixel is made lower than the impurity concentration of the third buried impurity doped layer of the peripheral circuit, whereby the capacitance difference between the black pixel and the color pixel can be made small.

When the depth of the second buried impurity doped layer immediately below the photodiode of the black pixel is varied by the implantation angle, the characteristics vary even with the photodiodes not buried (because of variations of the capacitance of the photodiode of the black pixel). This variation can be suppressed by forming the second buried impurity doped layer by similarly implanting ions in a random direction.

What is claimed is:

1. A solid-state image sensor comprising:
   a semiconductor substrate of a first conductivity type having a color pixel region and a black pixel region;
   a first well of the first conductivity type formed in the color pixel region;
   a second well of the first conductivity type formed in the black pixel region;
   a third well of a second conductivity type formed, surrounding the second well and isolating the second well from the rest region of the semiconductor substrate;
   a color pixel formed in the first well in the color pixel region and including a first photodiode and a first read transistor for reading a signal generated by the first photodiode; and
   a black pixel formed in the second well in the black pixel region and including a second photodiode and a second read transistor for reading a signal generated by the second photodiode,
   the first well including a first buried impurity doped layer of the first conductivity type formed at a bottom thereof in a region where the first read transistor is formed, and
   the second well including a second buried impurity doped layer of the first conductivity type formed at a bottom thereof in a region where the second photodiode is formed and a region where the second read transistor is formed.

2. A solid-state image sensor according to claim 1, wherein
   the first photodiode and the second photodiode are a buried-type photodiode,
   the color pixel further includes a first transfer transistor which transfer the signal generated by the first photodiode to the first read transistor,
   the black pixel further includes a second transfer transistor which transfers the signal generated by the second photodiode to the second read transistor, and
   the second buried impurity doped layer is formed also in a region where the second transfer transistor is formed.

3. A solid-state image sensor according to claim 2, wherein
   the first well includes a first impurity doped layer of the first conductivity type formed in the region where the first read transistor is formed, and a second impurity doped layer of the first conductivity type formed in a region where the first transfer transistor is formed and having an impurity concentration lower than that of the first impurity doped layer, and the second well includes a third impurity doped layer of the first conductivity type formed in the region where the second read transistor is formed, and a fourth impurity doped layer of the first conductivity type formed in the region where the second transfer transistor is formed and having an impurity concentration lower than that of the third impurity doped layer.

4. A solid-state image sensor according to claim 3, wherein
the first well includes a fifth impurity doped layer of the first conductivity type formed between the first photodiode and a device isolation film, the fifth impurity doped layer having an impurity concentration higher than that of the first impurity doped layer and that of the second impurity doped layer, and
the second well includes a sixth impurity doped layer of the first conductivity type formed between the second photodiode and a device isolation film, the sixth impurity doped layer having an impurity concentration higher than that of the third impurity doped layer and that of the fourth impurity doped layer.

5. A solid-state image sensor according to claim 4, wherein
the fifth impurity doped layer and the sixth impurity doped layer are formed deeper than the device isolation film.

6. A solid-state image sensor according to claim 1, further comprising:
a fourth well of the first conductivity type formed in a peripheral circuit region of the semiconductor substrate and including a third buried impurity doped layer of the first conductivity type at a bottom thereof, and
an impurity concentration of the first conductivity type of the third buried impurity doped layer is different from that of the first buried impurity doped layer and that of the second buried impurity doped layer.

7. A solid-state image sensor according to claim 6, wherein
the impurity concentration of the first conductivity type of the third buried impurity doped layer is higher than that of the first buried impurity doped layer and that of the second buried impurity doped layer.

8. A solid-state image sensor according to claim 6, wherein
a depth profile of impurities of the first conductivity type forming the first buried impurity doped layer and a depth profile of impurities of the first conductivity type forming the second buried impurity doped layer are acuter than a depth profile of impurities of the first conductivity type forming the third buried impurity doped layer.

9. A solid-state image sensor according to claim 3, which further comprises:
a fourth well of the first conductivity type formed in a peripheral circuit region of the semiconductor substrate and including a seventh impurity doped layer of the first conductivity type formed at a surface region thereof and a third buried impurity doped layer of the first conductivity type formed at a bottom thereof, and in which
an impurity concentration of the first conductivity type of the seventh impurity doped layer is different from that of the first impurity doped layer and that of the third impurity doped layer.

10. A solid-state image sensor according to claim 9, wherein
an impurity concentration of the first conductivity type of the seventh impurity doped layer is lower than that of the first impurity doped layer and that of the third impurity doped layer.

11. A solid-state image sensor according to claim 9, wherein
the first well includes an eighth impurity doped layer formed between the first impurity doped layer and the first buried impurity doped layer,
the second well includes a ninth impurity doped layer formed between the third impurity doped layer and the second buried impurity doped layer, and
an impurity concentration of the first conductivity type in the fourth well at a depth where the eighth impurity doped layer and the ninth impurity doped layer are formed is lower than that in the eighth impurity doped layer and that in the ninth impurity doped layer.

12. A solid-state image sensor according to claim 6, further comprising:
a fifth well of the second conductivity type formed, surrounding the fourth well and isolating the fourth well from the rest region of the semiconductor substrate.

13. A solid-state image sensor according to claim 9, further comprising:
a fifth well of the second conductivity type formed, surrounding the fourth well and isolating the fourth well from the rest region of the semiconductor substrate.

14. A solid-state image sensor according to claim 1, wherein
an end of the first buried impurity doped layer is spaced from an end of the first photodiode.

15. A solid-state image sensor according to claim 1, wherein
the second buried impurity doped layer has a lower impurity concentration of the first conductivity type in the region where the second photodiode is formed than in the region where the second read transistor is formed.

16. A solid-state image sensor according to claim 1, wherein
the first photodiode and the second photodiode are a buried-type photodiode, and
an impurity concentration of the second conductivity type at the bottom of a buried diffused layer of the second photodiode is higher than an impurity concentration of the second conductivity type at the bottom of a buried diffused layer of the first photodiode.

17. A solid-state image sensor according to claim 1, wherein
the first read transistor and the second read transistor each include a first transistor amplifying a signal outputted from the photodiode, a second transistor resetting an input terminal of the first transistor and a third transistor reading a signal outputted by the first transistor.

18. A method for fabricating a solid-state image sensor comprising: a first well of a first conductivity type formed in a color pixel region of a semiconductor substrate of the first conductivity type; a second well of the first conductivity type formed in a black pixel region of the semiconductor substrate; a third well of a second conductivity type formed, surrounding the second well and isolating the second well from the rest region of the semiconductor substrate; a color pixel formed in the first well and including a first photodiode and a first read transistor reading a signal generated by the first photodiode; and a black pixel formed in the second well and including a second photodiode and a second read transistor reading a signal generated by the second photodiode, the method comprising the step of:

implanting an impurity of the first conductivity type to form a first buried impurity doped layer in a bottom of the first well in a region for the first read transistor to be formed in and a second buried impurity doped layer in a bottom of the second well in a region for the second photodiode to be formed in and a region for the second read transistor to be formed in.

19. A method for fabricating a solid-state image sensor according to claim 18, wherein the first buried impurity doped layer and the second buried impurity doped layer are formed by ion-implanting an impurity of the first conductivity type in a random direction.

20. A method for fabricating a solid-state image sensor according to claim 18, further comprising the step of:

ion implanting an impurity of the first conductivity type in a peripheral circuit region of the semiconductor substrate in the direction normal to the semiconductor substrate to form a third buried impurity doped layer of the first conductivity type, a fourth well of the first conductivity type including the third buried impurity doped layer of the first conductivity type being formed in the peripheral circuit region.

\* \* \* \* \*